(12) United States Patent
Kanakasabapathy et al.

(10) Patent No.: US 10,475,886 B2
(45) Date of Patent: Nov. 12, 2019

(54) MODIFIED FIN CUT AFTER EPITAXIAL GROWTH

(71) Applicant: International Business Machines Corporation, Armonk, NY (US)

(72) Inventors: Sivananda K. Kanakasabapathy, Niskayuna, NY (US); Fee Li Lie, Albany, NY (US); Soon-Cheon Seo, Glenmont, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/571,504

(22) Filed: Dec. 16, 2014

(65) Prior Publication Data
US 2016/0172379 A1  Jun. 16, 2016

(51) Int. Cl.
| | |
|---|---|
| *H01L 29/161* | (2006.01) |
| *H01L 29/16* | (2006.01) |
| *H01L 21/8234* | (2006.01) |
| *H01L 21/8238* | (2006.01) |
| *H01L 21/84* | (2006.01) |
| *H01L 29/78* | (2006.01) |
| H01L 21/308 | (2006.01) |
| H01L 29/66 | (2006.01) |

(52) U.S. Cl.
CPC ...... *H01L 29/16* (2013.01); *H01L 21/823431* (2013.01); *H01L 21/823821* (2013.01); *H01L 21/845* (2013.01); *H01L 29/7848* (2013.01); H01L 21/3086 (2013.01); H01L 29/66545 (2013.01)

(58) Field of Classification Search
CPC ..................................................... H01L 21/308
USPC ......................................................... 257/598
See application file for complete search history.

(56) References Cited

U.S. PATENT DOCUMENTS

| | | | |
|---|---|---|---|
| 6,872,647 B1 | 3/2005 | Yu et al. | |
| 6,987,289 B2 | 1/2006 | Nowak | |
| 7,087,532 B2 | 8/2006 | Dobuzinsky et al. | |
| 7,187,046 B2 | 3/2007 | Wu et al. | |
| 8,569,152 B1 | 10/2013 | Basker et al. | |
| 8,617,996 B1 * | 12/2013 | Chi .................. | H01L 21/30604 257/E21.377 |
| 2009/0253238 A1 | 10/2009 | Shi et al. | |
| 2012/0261756 A1 | 10/2012 | Kanike et al. | |
| 2012/0276695 A1 * | 11/2012 | Cheng ................ | H01L 27/1211 438/154 |
| 2013/0049136 A1 | 2/2013 | Wahl et al. | |
| 2013/0134513 A1 | 5/2013 | Standaert et al. | |
| 2013/0161744 A1 * | 6/2013 | Basker ............. | H01L 29/66795 257/347 |

(Continued)

OTHER PUBLICATIONS

He et al., "Densely Spaced Fins for Semiconductor Fin Field Effect Transistors", U.S. Appl. No. 14/198,005, filed Mar. 5, 2014, 29 pages.

(Continued)

*Primary Examiner* — Joseph C. Nicely
*Assistant Examiner* — Lamont B Koo
(74) *Attorney, Agent, or Firm* — Steven J. Meyers; Hoffman Warnick LLC

(57) ABSTRACT

A method of forming a gate located above multiple fin regions of a semiconductor device. The method may include removing unwanted fin structures after epitaxially growing junctions.

10 Claims, 25 Drawing Sheets

(56) References Cited

U.S. PATENT DOCUMENTS

| | | | |
|---|---|---|---|
| 2013/0319613 A1* | 12/2013 | Basker | H01L 29/66795 |
| | | | 156/345.24 |
| 2013/0330889 A1* | 12/2013 | Yin | H01L 21/823821 |
| | | | 438/197 |
| 2014/0110817 A1 | 4/2014 | Bergendahl et al. | |
| 2014/0131813 A1 | 5/2014 | Liaw | |
| 2015/0243667 A1* | 8/2015 | Liaw | H01L 27/1104 |
| | | | 257/390 |
| 2015/0325646 A1* | 11/2015 | Lai | H01L 29/0653 |
| | | | 257/369 |
| 2015/0325686 A1 | 11/2015 | Allibert et al. | |
| 2016/0172380 A1 | 6/2016 | Kanakasabapathy et al. | |

OTHER PUBLICATIONS

Yamashita et al., "Sub-25nm FinFET with Advanced Fin Formation and Short Channel Effect Engineering", Symposium on VLSI Technology Digest of Technical Papers, 2011, pp. 14-15.

Liu et al., "Towards Electrical Testable SOI Devices Using Directed Self-Assembly for Fin Formation", Proc. of SPIE, vol. 9049, 904909, 2014 SPIE, doi: 10.1117/12.2046462, 12 pages.

Lamont. Final Office Action Communication for U.S. Appl. No. 14/836,264, dated Mar. 17, 2016, 13 pages.

Lamont. Office Action Communication for U.S. Appl. No. 14/836,264, dated Jun. 17, 2016, 7 pages.

Koo. Office Action Communication for U.S. Appl. No. 14/836,264, dated Nov. 1, 2016, 13 pages.

U.S. Appl. No. 14/836,264, Office Action 3 dated Feb. 27, 2017, 8 pages.

U.S. Appl. No. 14/836,264, Final Office Action 3 dated Jun. 14, 2017, 13 pages.

U.S. Appl. No. 14/836,264, Office Action 4 dated Sep. 22, 2017, 9 pages.

U.S. Appl. No. 14/836,264, Non-Final Office Action dated Nov. 17, 2015, 13 pages.

U.S. Appl. No. 14/836,264, Office Action dated Feb. 8, 2018, 12 pages.

U.S. Appl. No. 14/836,264, Final Office Action dated Jan. 2, 2019, 15 pages.

U.S. Appl. No. 14/836,264, Office Action dated Jun. 29, 2018, 15 pages.

U.S. Appl. No. 14/836,264, Non-Final Office Action dated Apr. 2, 2019, 17 pages.

* cited by examiner

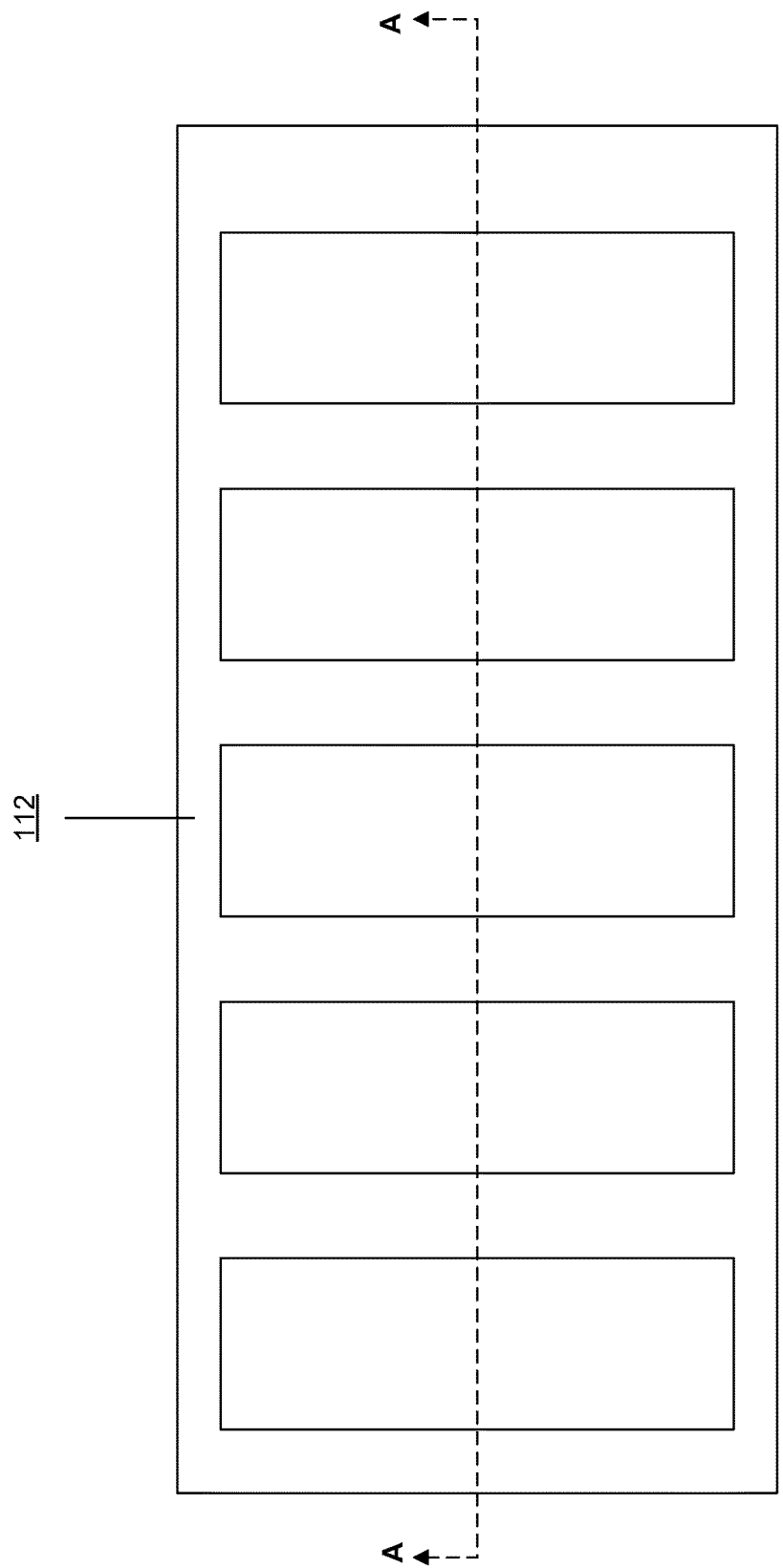

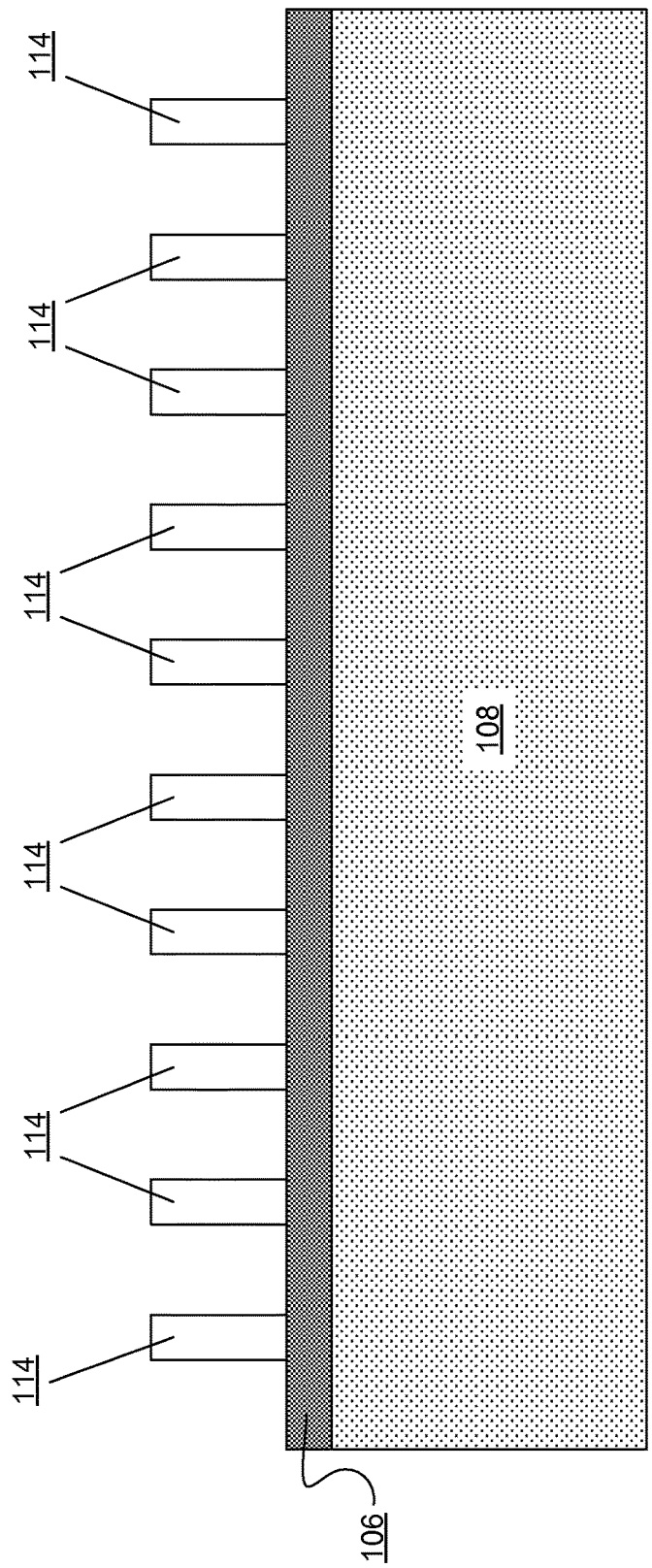

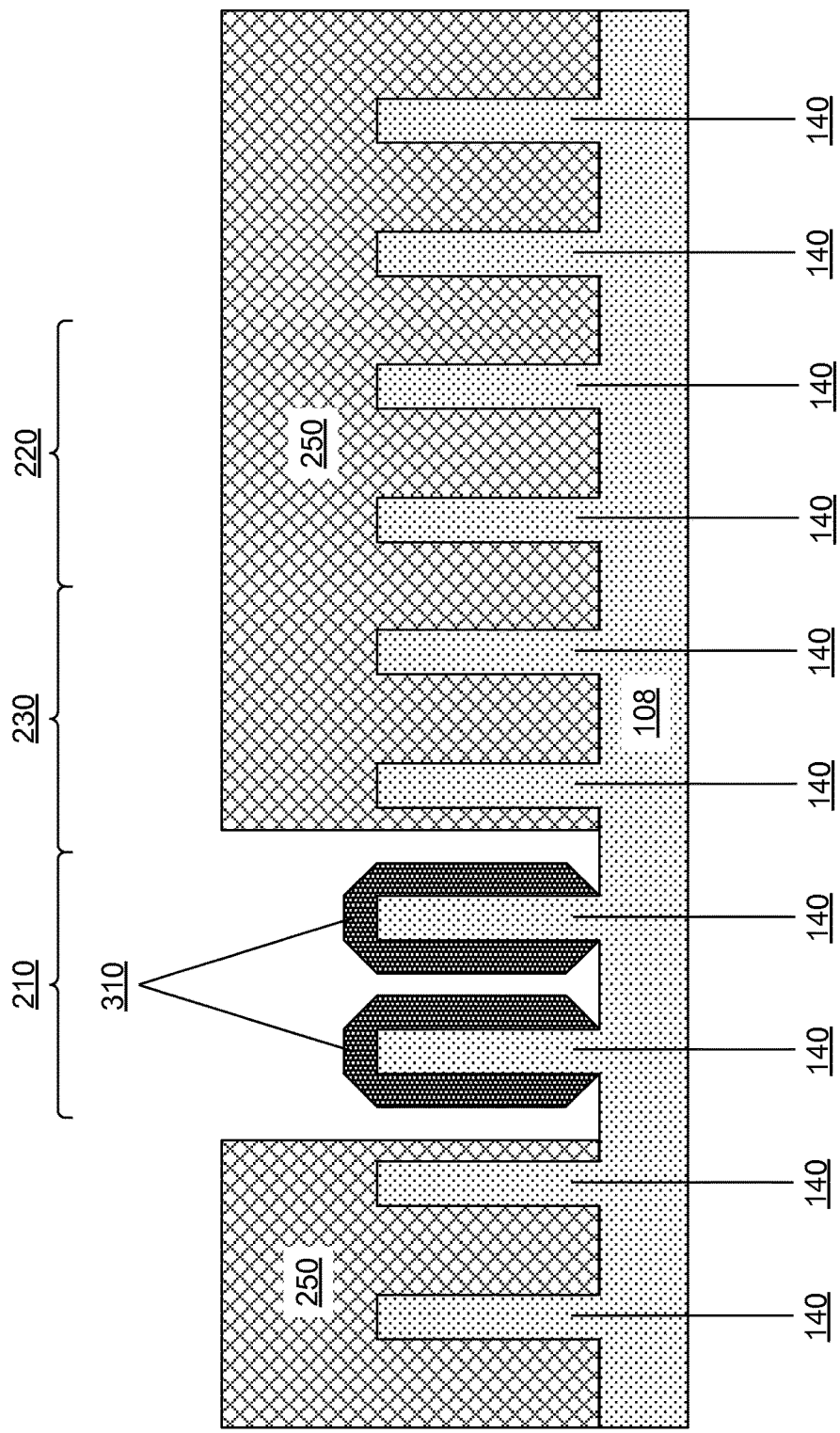

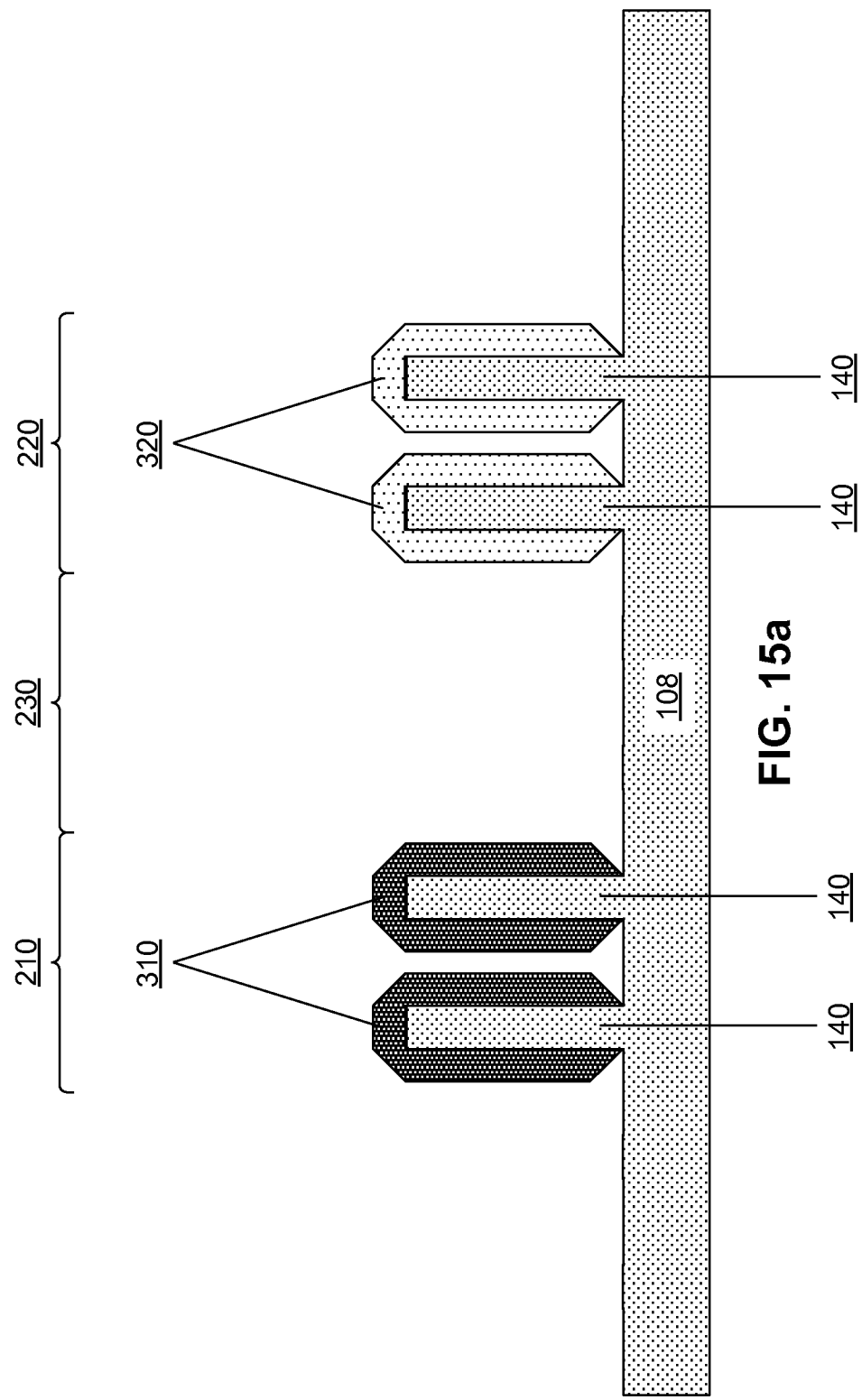

MODIFIED FIN CUT AFTER EPITAXIAL GROWTH

BACKGROUND

The present invention relates to semiconductor devices, and particularly to forming source/drain regions and connections on fin field effect transistors.

Field effect transistors (FETs) are commonly employed in electronic circuit applications. FETs may include a source region and a drain region spaced apart by a semiconductor channel region. A gate, including a gate dielectric layer, a work function metal layer, and a metal electrode, may be formed above the channel region. By applying voltage to the gate, the conductivity of the channel region may increase and allow current to flow from the source region to the drain region.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are fabricated on the same substrate.

BRIEF SUMMARY

An embodiment of the invention may include a method of forming a semiconductor structure. The method may include forming fins in a first region, an intermediate region and second region of a substrate. The method may include forming a gate over the at least one fin in the first region of the substrate, the at least one fin in the second region of the substrate and the at least one fin in the intermediate region of the substrate. The method may include forming a first mask above at least the intermediate region of the substrate and the second region of the substrate and epitaxially growing a first junction on the at least one fin located in the first region of the substrate. The method may include removing the first mask, forming a second mask above at least the intermediate region of the substrate and the first region of the substrate and epitaxially growing a second junction on the at least one fin located in the second region of the substrate. The method may include removing the second mask and forming a third mask above the first region of the substrate, the second region of the substrate and the gate. The method may include removing material from the unmasked region and removing the third mask.

Another embodiment of the invention may include a semiconductor structure. The structure may include a first plurality of fins located in a first region of a substrate, where a first junction is located on the first set of fins. The structure may include a second plurality of fins located in a second region of the substrate, where a second junction is located on a second set of fins. The structure may include an intermediate plurality of fins located in an intermediate region of the substrate, where the intermediate region is located between the first and second region. The structure may include a gate running substantially perpendicular to the first plurality of fins, the intermediate plurality of fins, and the third plurality of fins.

BRIEF DESCRIPTION OF THE SEVERAL DRAWINGS

FIG. 2 is a top view of mandrels on the substrate covered by a deposited spacer film, according to an exemplary embodiment;

FIG. 4a is a cross-sectional view of FIG. 4 taken along section line A-A, of fins formed on the substrate, according to an exemplary embodiment;

FIG. 11a is a cross-sectional view of FIG. 11 taken along section line A-A, of epitaxially growing a material on the fins in a first region, according to an exemplary embodiment;

FIG. 15a is a cross-sectional view of FIG. 15 taken along section line A-A, of fins and a gate located on a substrate, according to an exemplary embodiment;

Figure 1:
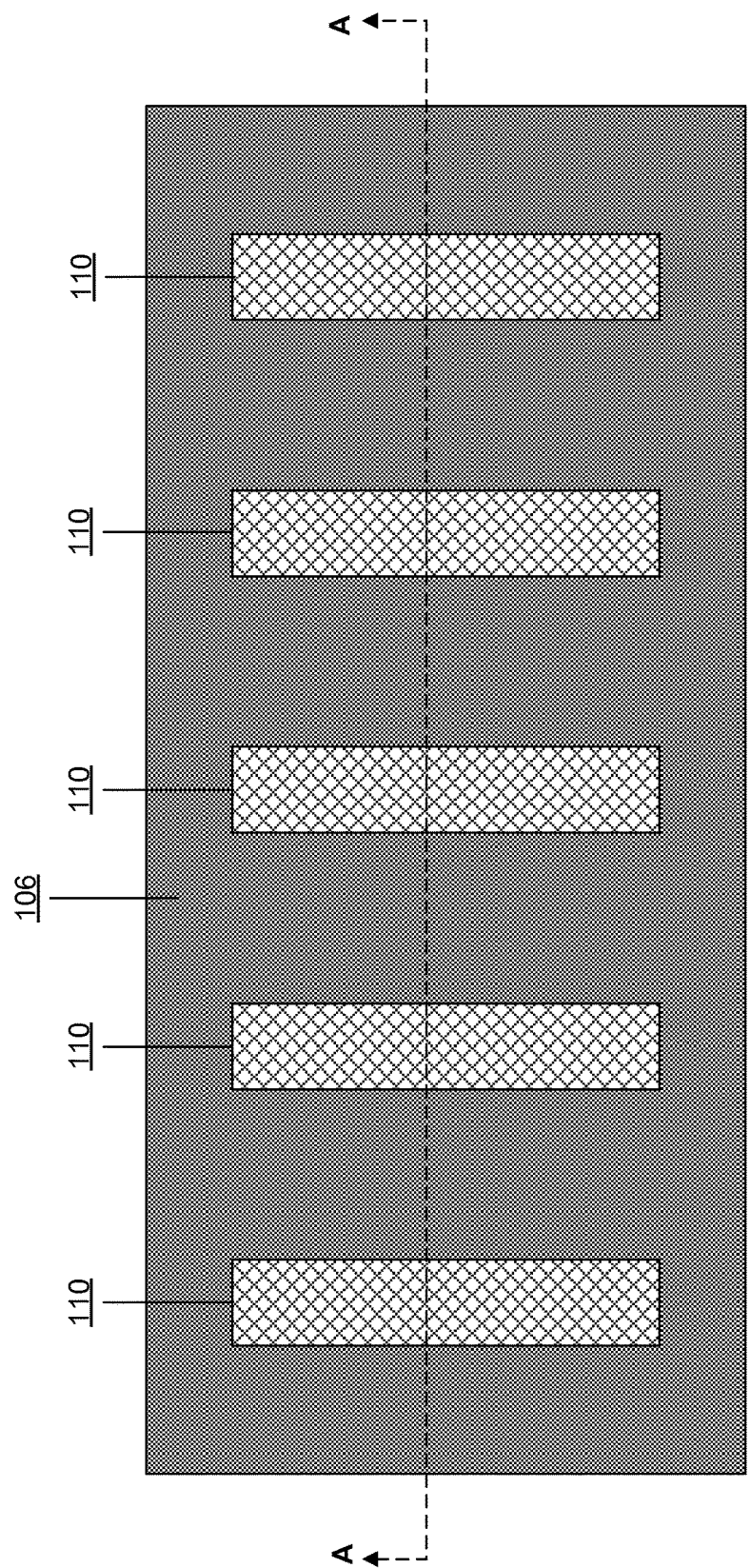
FIG. 1 is a top view of mandrels formed on a substrate, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FinFET structures may be created using sidewall image transfer as a way to create a pattern to transfer the desired fin pattern onto an underlying substrate. Such structures may create a substrate that contains multiple regions, with high variability of aspect ratios between each region. This may result in a non-uniform deposition of material from one region to, as fluids flow more slowly into voids with high aspect ratios, and may create uneven densities between the regions. This may create problems during chemical mechanical planarization (CMP), as less dense regions would be removed much more easily than other regions, leading to an uneven surface. Additionally, the variable density may ultimately impact the performance of the device, due to the differences in the resulting structures across the device. By performing deposition techniques across regions with substantially similar aspect ratios, structures may be created having substantially similar densities across the device.

Figure 1A:
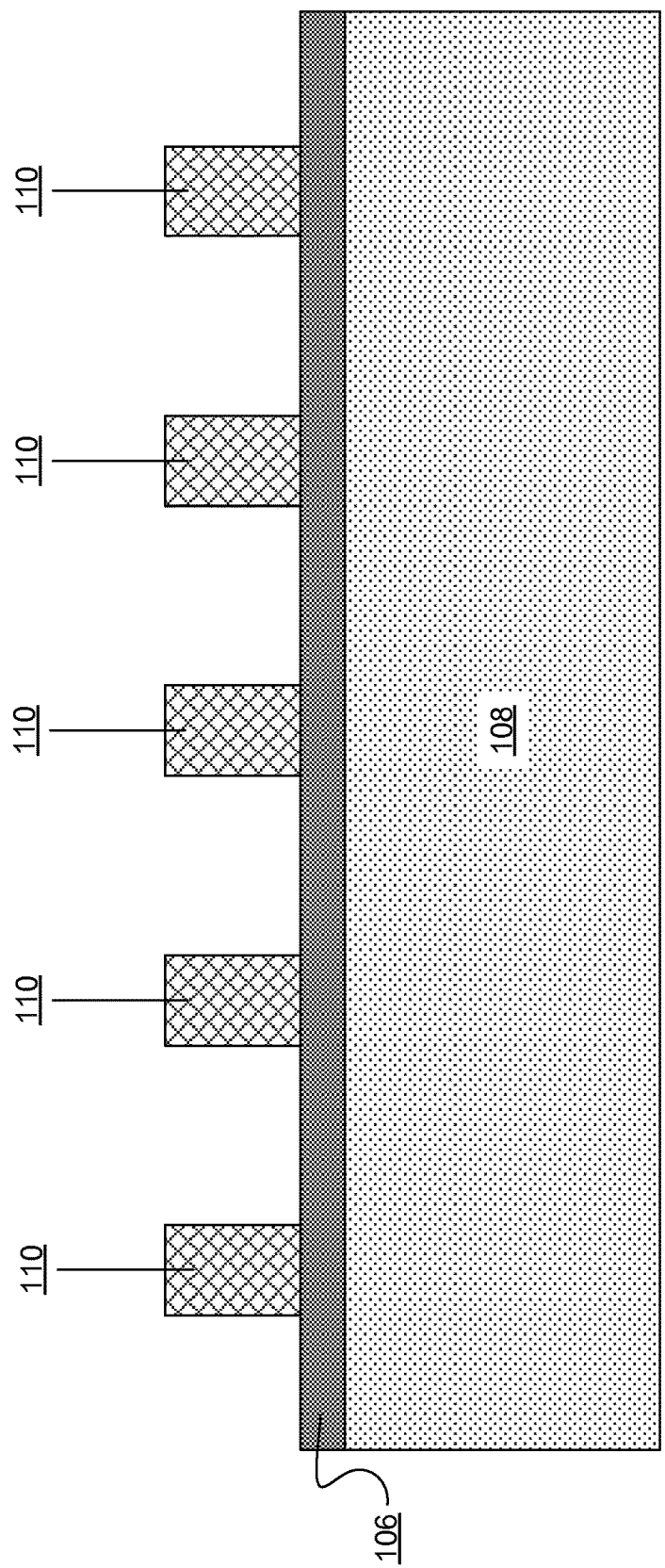
FIG. 1a is a cross-sectional view of FIG. 1 taken along section line A-A, of mandrels formed on a hardmask, according to an exemplary embodiment.

Referring now to FIGS. 1 and 1a, at least one mandrel may be formed above a hardmask layer, located on a semiconductor material. More specifically, the method may begin with providing a hardmask layer 106 above a substrate 108, and subsequently forming a mandrel 110 on top of the hardmask layer 106. The substrate 108 may include a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A bulk substrate is illustrated in the figures and is relied upon for the corresponding discussion. The hardmask layer 106 may include multiple layers. In one embodiment, the hardmask layer 106 may include silicon oxide, silicon nitride, a metal-nitride, such as titanium-nitride (TiN), boron-nitride (BN), or a metal-oxide, or any combination thereof. Further, in one embodiment, the hardmask layer 106 may have a thickness, in some embodiments, ranging from about 5 nm to about 80 nm.

The mandrel 110 may be generated using known photolithography and masking techniques. During this step, a mandrel layer may be formed on top of the hardmask layer 106. The mandrel layer may include amorphous silicon or any silicon based compound, for example, silicon nitride, silicon oxide, or silicon carbon, or alternatively amorphous carbon. The mandrel layer may preferably include a material that is different enough from the material of the sidewall spacers (described below) and the material of the hardmask layer 106 so that it may be selectively removed. The particular material chosen may partly depend upon the desired pattern to be formed and the materials chosen in subsequent steps discussed below. In one embodiment, the mandrel layer may be formed with a vertical thickness ranging from about 30 nm to about 150 nm. The mandrel layer may then be lithographically patterned to create the mandrel 110. The mandrel 110 may be formed by applying known patterning techniques involving exposing a photo-resist and transferring the exposed pattern of the photo-resist by etching the mandrel layer.

Figure 2A:
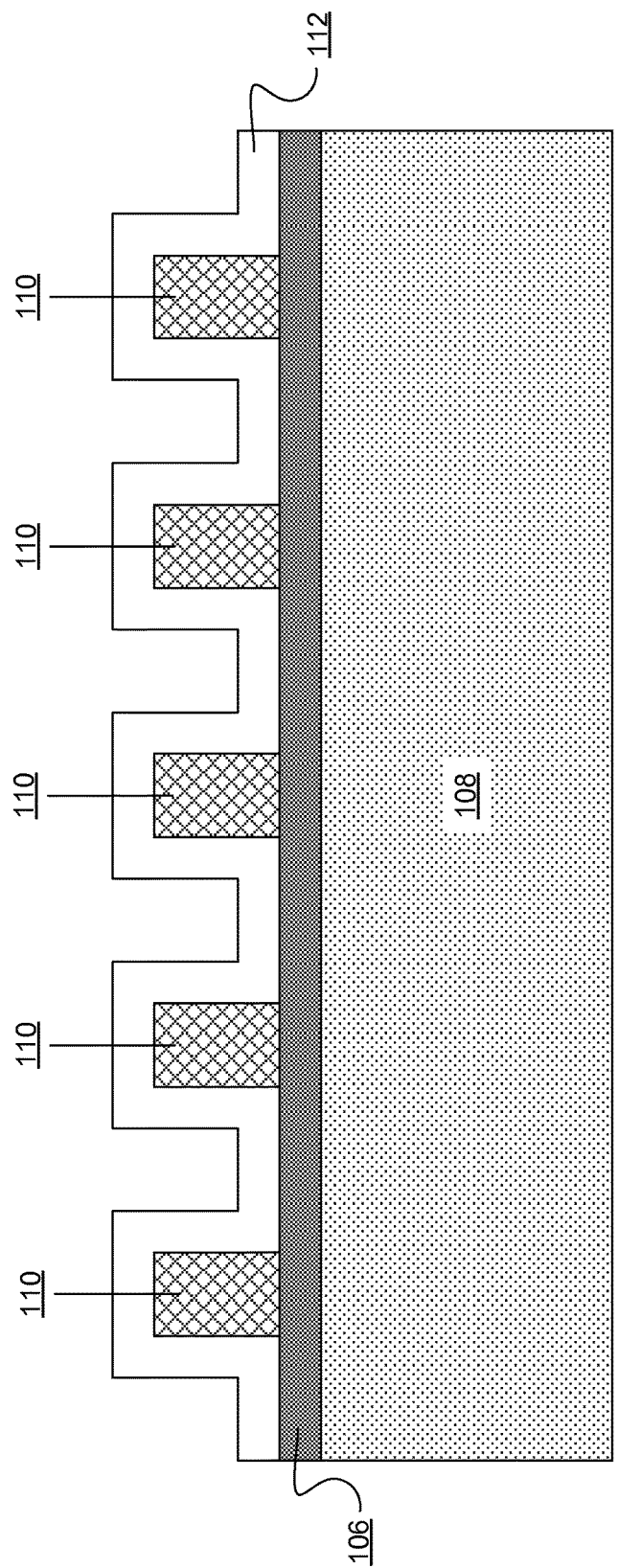
FIG. 2a is a cross-sectional view of FIG. 2 taken along section line A-A, of mandrels on the substrate covered by a deposited spacer film, according to an exemplary embodiment.

Referring now to FIGS. 2 and 2a, a patterning material may be deposited above the hardmask and the mandrel. More specifically, the method may include conformally depositing a layer of material (hereinafter "conformal layer 112") directly on top of the hardmask layer 106 and the mandrel 110. The conformal layer may include any material capable of being selectively maintained with respect to the mandrel 110. In one embodiment, the conformal layer 112 may include, for example, silicon nitride or silicon oxide. It should be noted, however, that the conformal layer 112 should be of a material capable of being removed selective to the hardmask layer 106. For example, if the hardmask layer 106 is an oxide then the conformal layer 112 may preferably be a nitride, or alternatively, if the hardmask layer 106 is a nitride then the conformal layer 112 may preferably be an oxide. The conformal layer 112 may be deposited with a conformal deposition technique, using any known atomic layer deposition technique, molecular layer deposition techniques, or future developed deposition technique. In one embodiment, the conformal layer 112 may have a substantially uniform thickness. In one embodiment, the conformal layer 112 may have a conformal and uniform thickness ranging from about 5 nm to about 50 nm.

Figure 3:
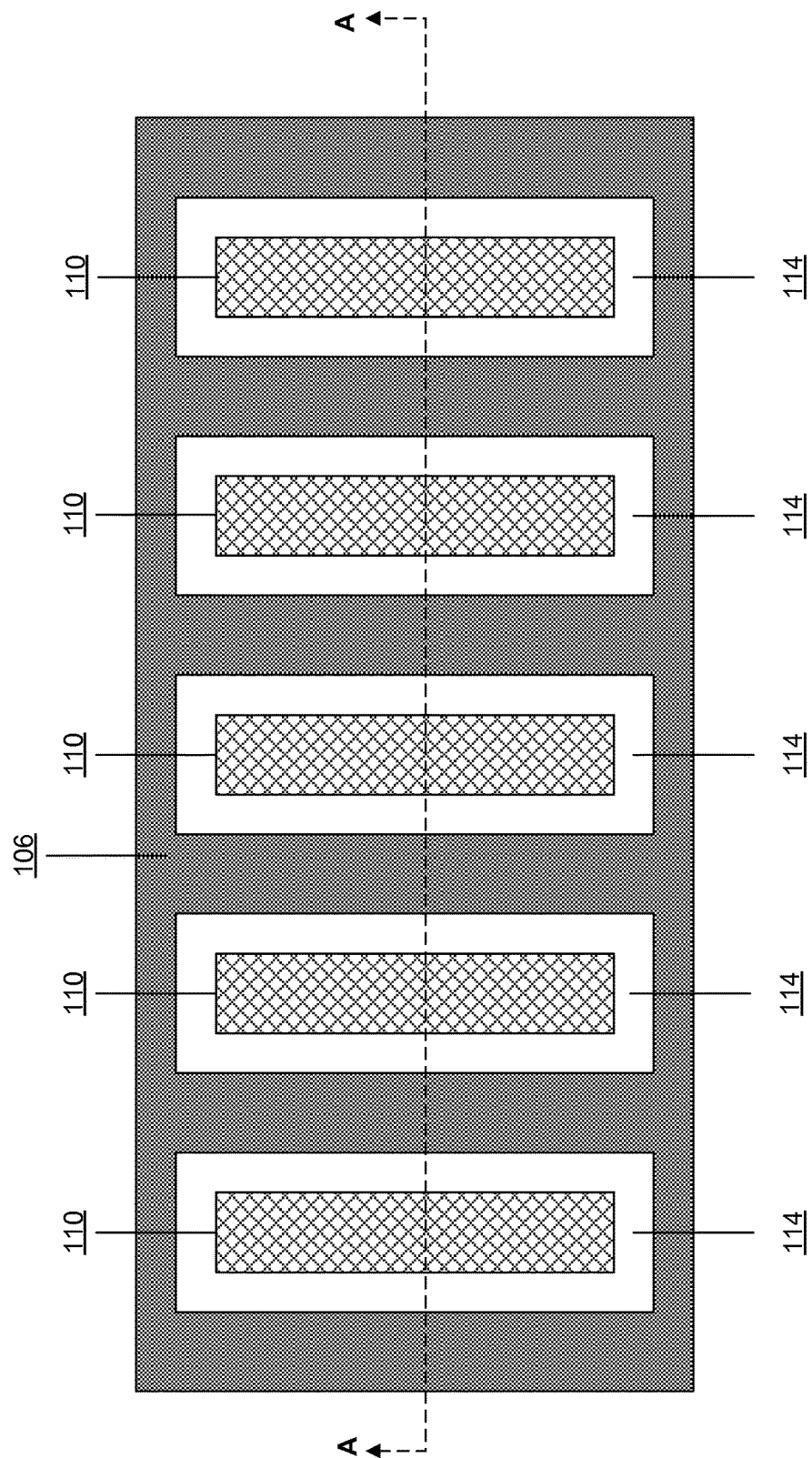
FIG. 3 is a top view of mandrels formed on the substrate after an etch of the spacer film, according to an exemplary embodiment.
Figure 3A:
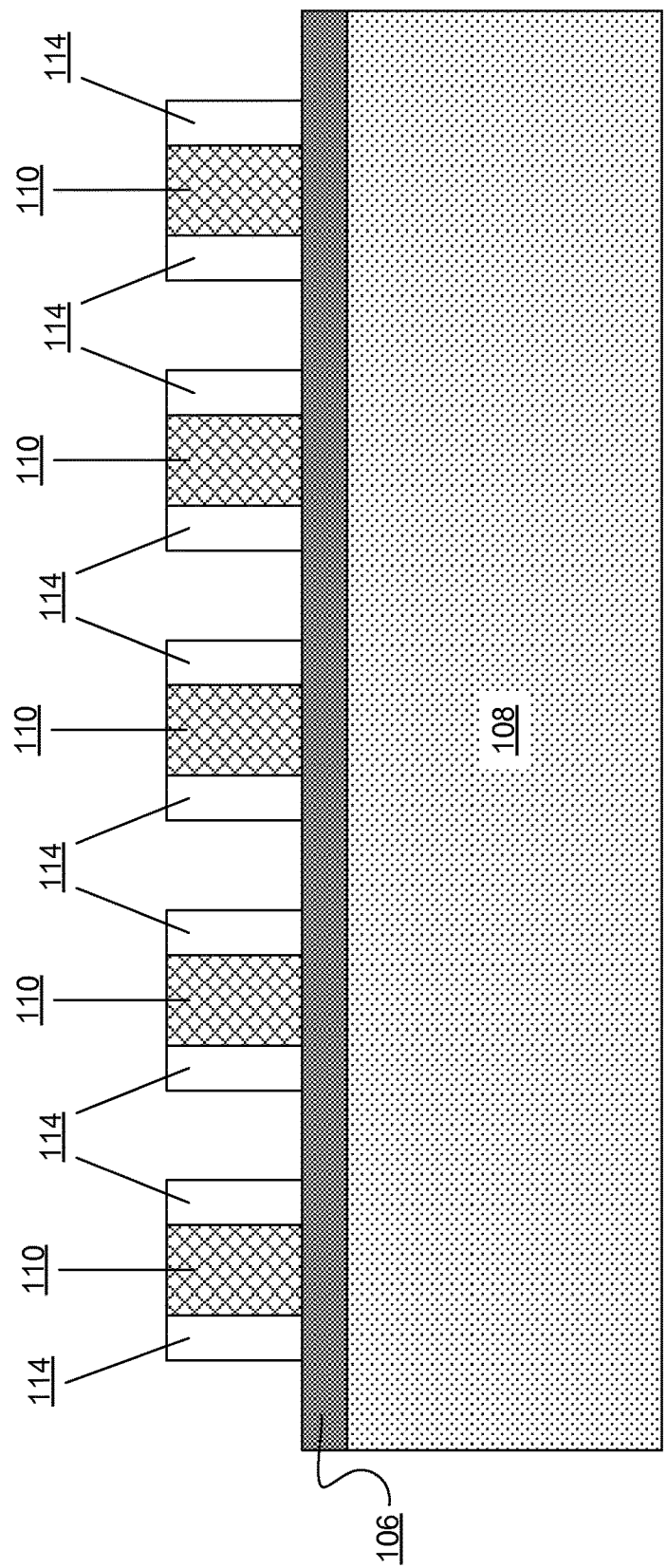
FIG. 3a is a cross-sectional view of FIG. 3 taken along section line A-A, of mandrels formed on the substrate after an etch of the spacer film, according to an exemplary embodiment.

Referring now to FIGS. 3 and 3a, the patterning material may be etched to form sidewall structures located on the sides of the mandrels. More specifically, the method may include forming sidewall spacers 114 by subjecting the conformal layer 112 (FIG. 2) to a directional etching process such as a reactive-ion-etching technique. The directional etching process may remove a portion of the conformal layer 112 (FIG. 2) from above the hardmask layer 106 and from the top of the mandrel 110. A portion of the dielectric layer may remain along opposite sidewalls of the mandrel 110, forming the sidewall spacers 114. Furthermore, the mandrel 110 and the sidewall spacers 114 should each include materials that would allow the mandrel 110 to be subsequently removed selective to the sidewall spacers 114. Here, it should also be noted that the sidewall spacers 114 depicted in FIGS. 3 and 3A are for illustration purposes and generally may have a slightly different shape from those shown. For example, the sidewall spacers 114 may have rounded corners that may be naturally formed during the directional etching process as is known in the art. The sidewall spacers 114 will eventually define a fin pattern which ultimately may be transferred into the underlying substrate 108.

Figure 4:
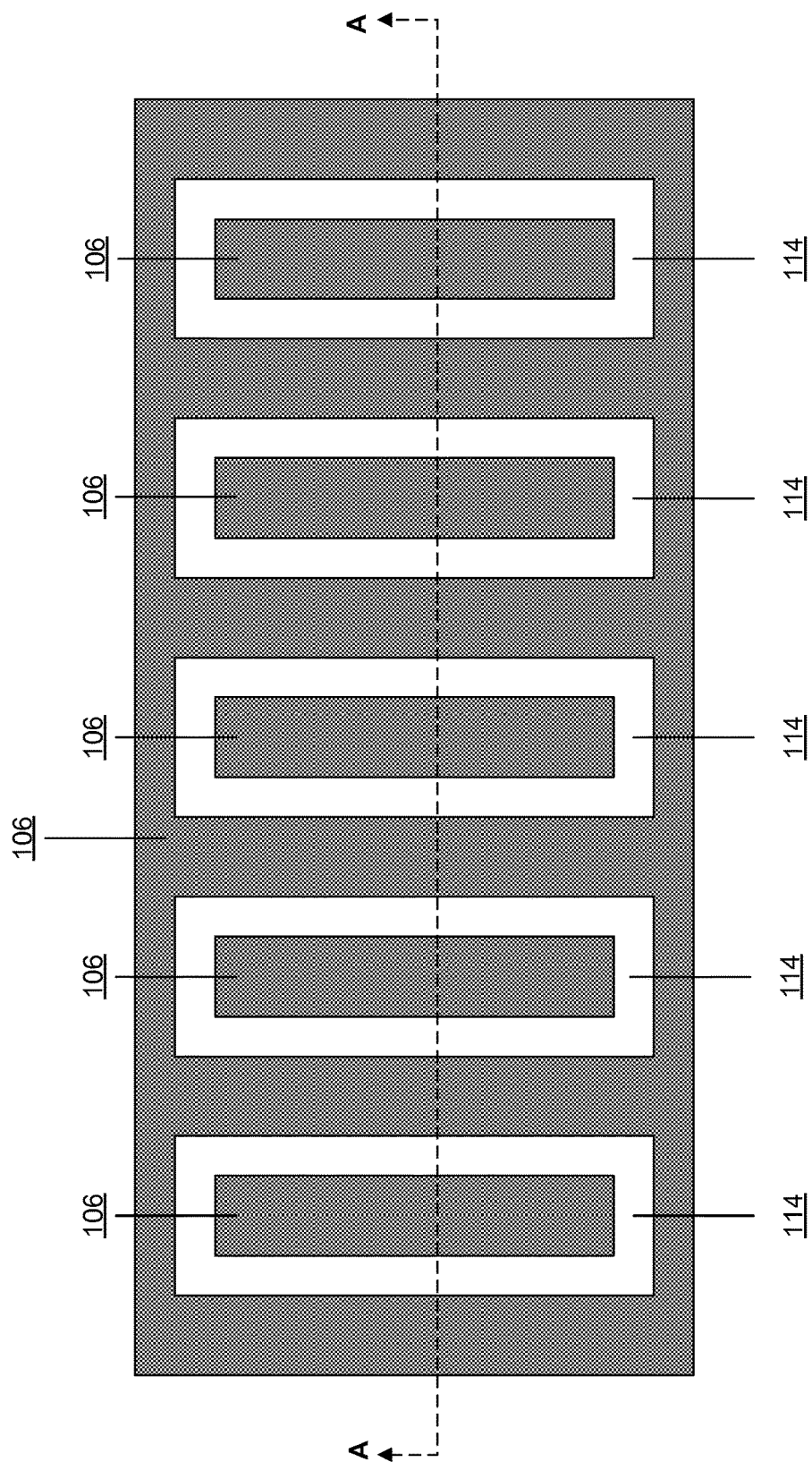
FIG. 4 is a top view of fins formed on the substrate, according to an exemplary embodiment.

Referring now to FIGS. 4 and 4a, the mandrels may be removed, leaving only the sidewall structures. More specifically, the mandrel 110 may be removed selective to the sidewall spacers 114. A non-selective breakthrough etch may be applied to the mandrel 110. In one embodiment, the mandrel 110 is silicon, and the sidewall spacers 114 are an oxide. In such cases, the silicon may be removed selective to the oxide. Furthermore, the mandrel 110 may be removed selective to the hardmask layer 106. In one embodiment, the mandrel 110 may be removed using a typical standard clean technique, including ammonium hydroxide and hydrogen peroxide, in which the sidewall spacers 114 will not be trimmed.

Figure 5:
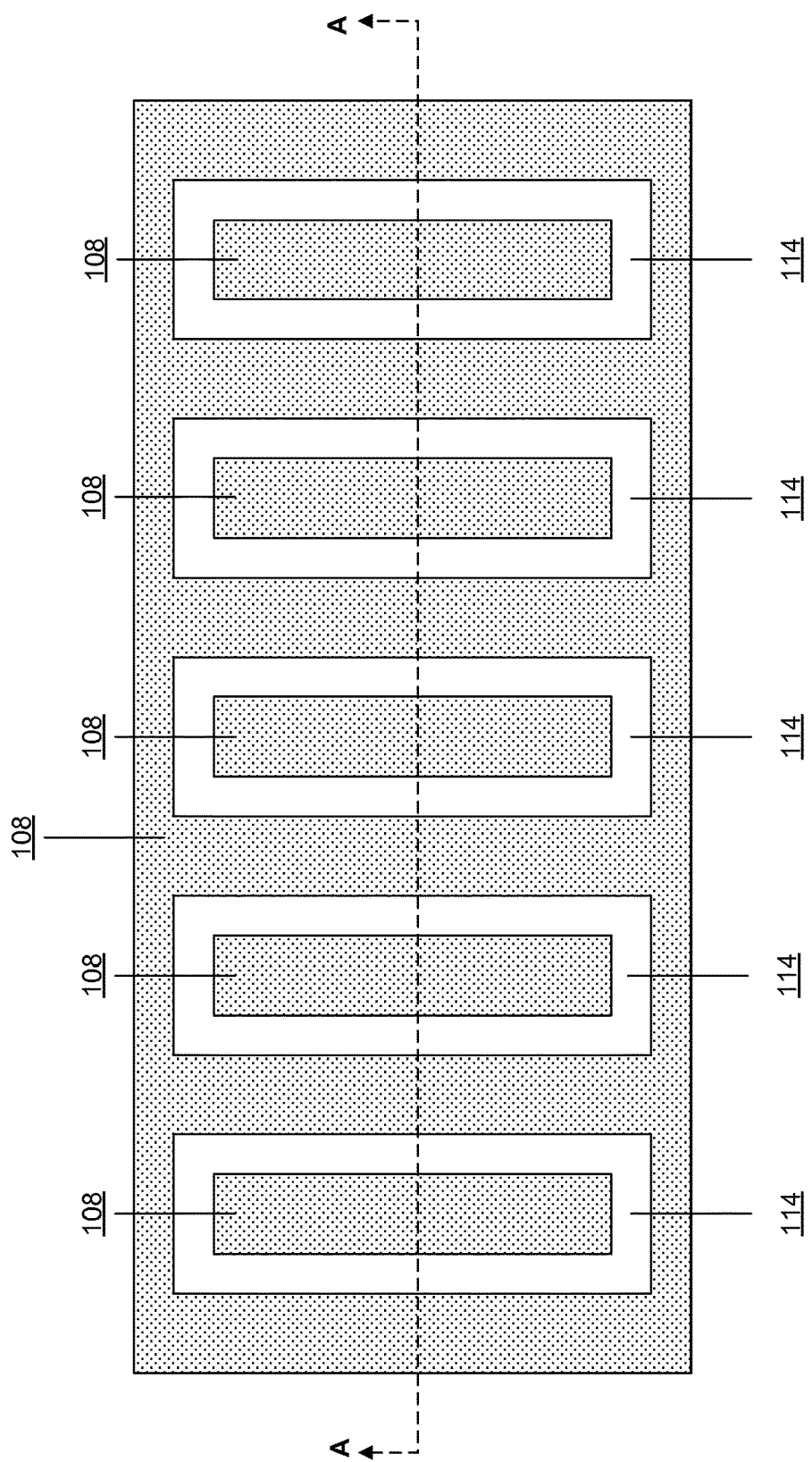
FIG. 5 is a top view of fins formed on the substrate, according to an exemplary embodiment.
Figure 5A:
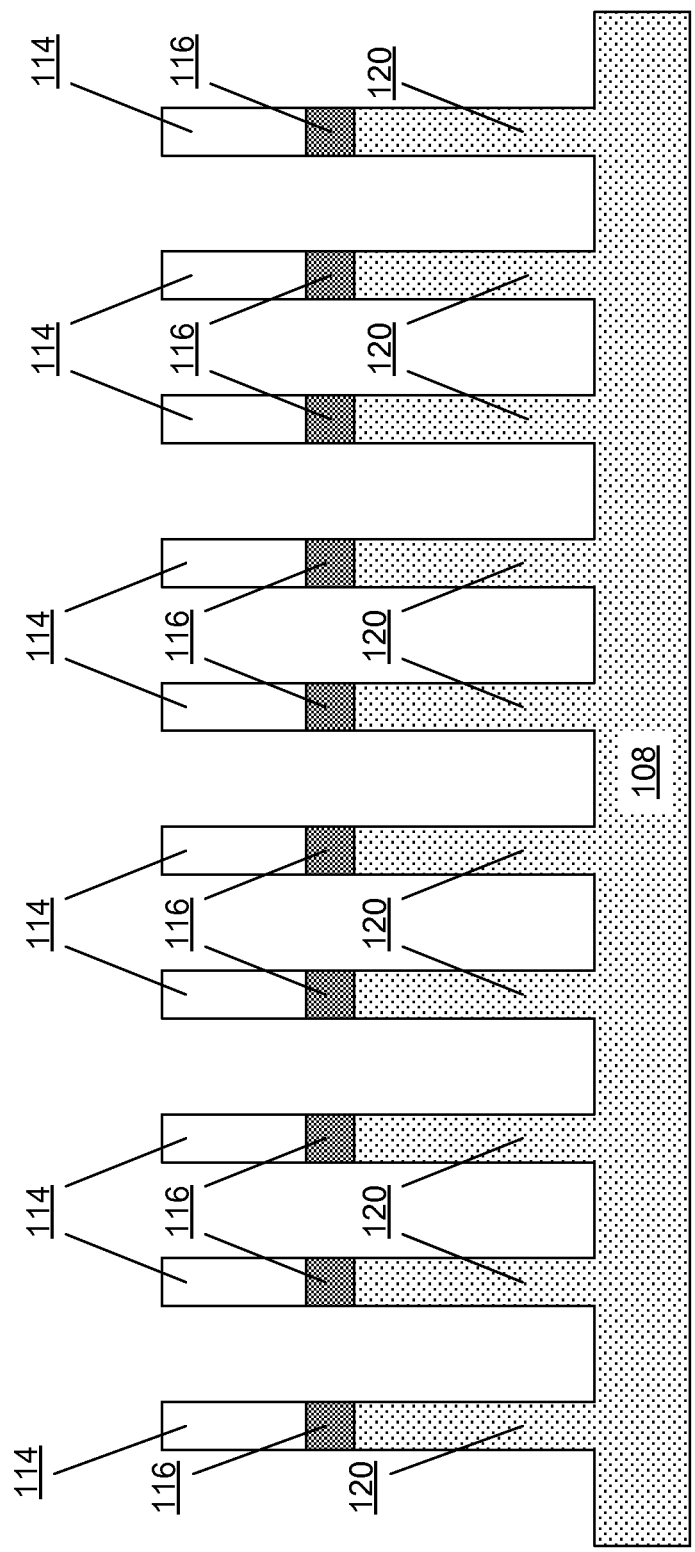
FIG. 5a is a cross-sectional view of FIG. 5 taken along section line A-A, of fins formed on the substrate, according to an exemplary embodiment.

Referring now to FIGS. 5 and 5a, an anisotropic etch may be performed to transfer the patterns of the sidewall to the underlying semiconductor material. More specifically, a fin pattern defined by the sidewall spacers 114 may be transferred into the substrate 108 using a multi-sequence etching technique. First, the hardmask layer 106 (FIGS. 4 and 4a) may be etched to expose the substrate 108. A directional etching technique such as a reactive-ion-etching (RIE) technique may be used to etch the hardmask layer 106, forming fin caps 116. In one embodiment, where the hardmask layer 106 is an oxide, a reactive-ion-etching technique using a fluorocarbon based etchant with additional gases such as $O_2$ or Ar may be used. In the present step, the sidewall spacers 114 may function as a mask, and may have high etch selectivity relative to the hardmask layer 106.

Next, the substrate 108 may then be etched to a desired depth, form at least one fin body 120. The desired depth may depend on the ultimate function of the semiconductor structure. A directional etching technique such as a reactive-ion-etching technique may be used to etch the substrate 108. In one embodiment, the substrate 108 may be etched with a reactive-ion-etching technique using a chlorine or a bromine based etchant. In the present step, the hardmask layer 106 may function as a mask, and may have a high etch-selectivity relative to the substrate 108. Furthermore, the sidewall spacers 114 and the hardmask layer 106 may be removed in subsequent steps using any suitable removal technique known in the art.

Figure 6:
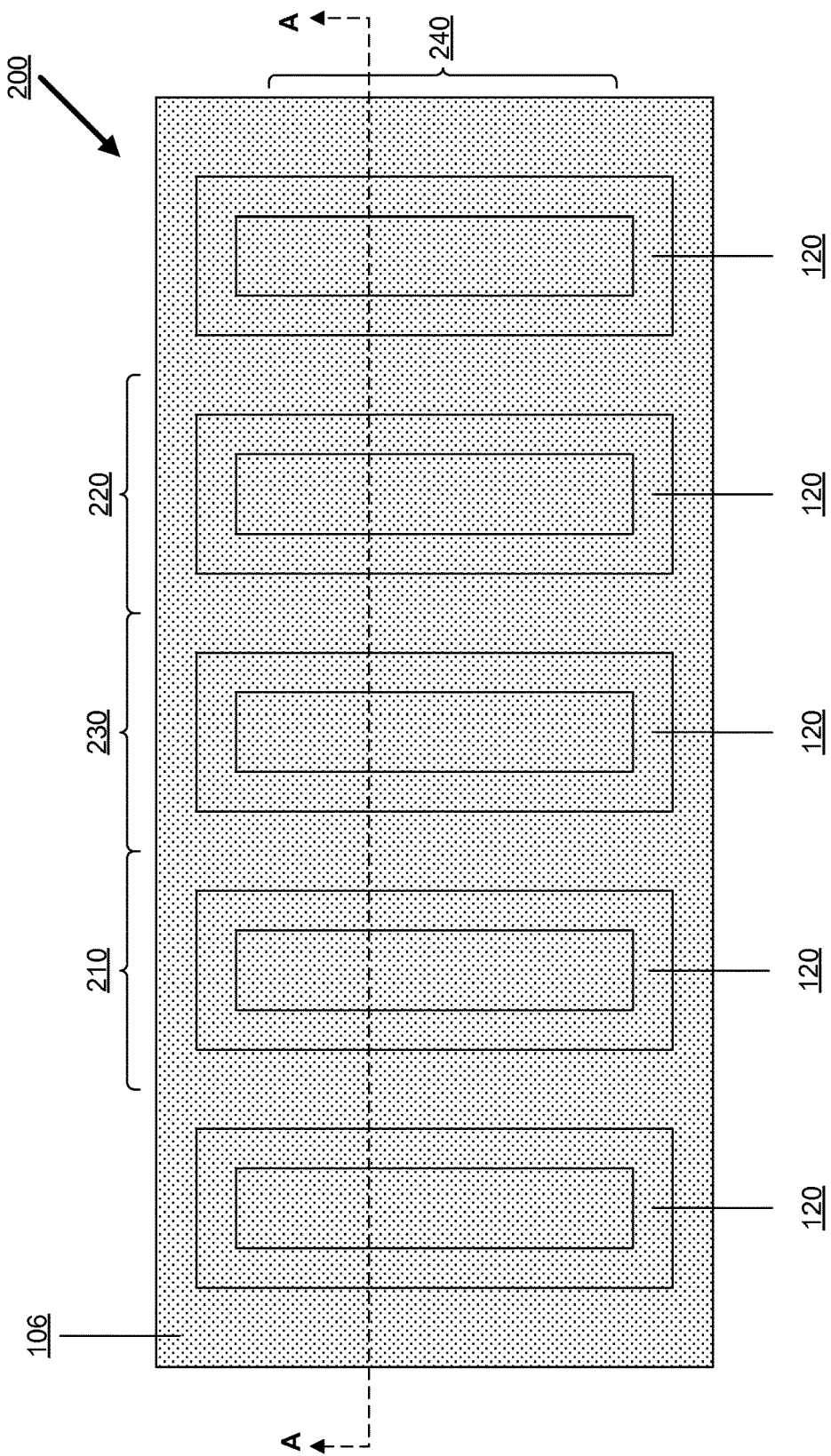
FIG. 6 is a top view of fins formed on the substrate, according to an exemplary embodiment.
Figure 6A:
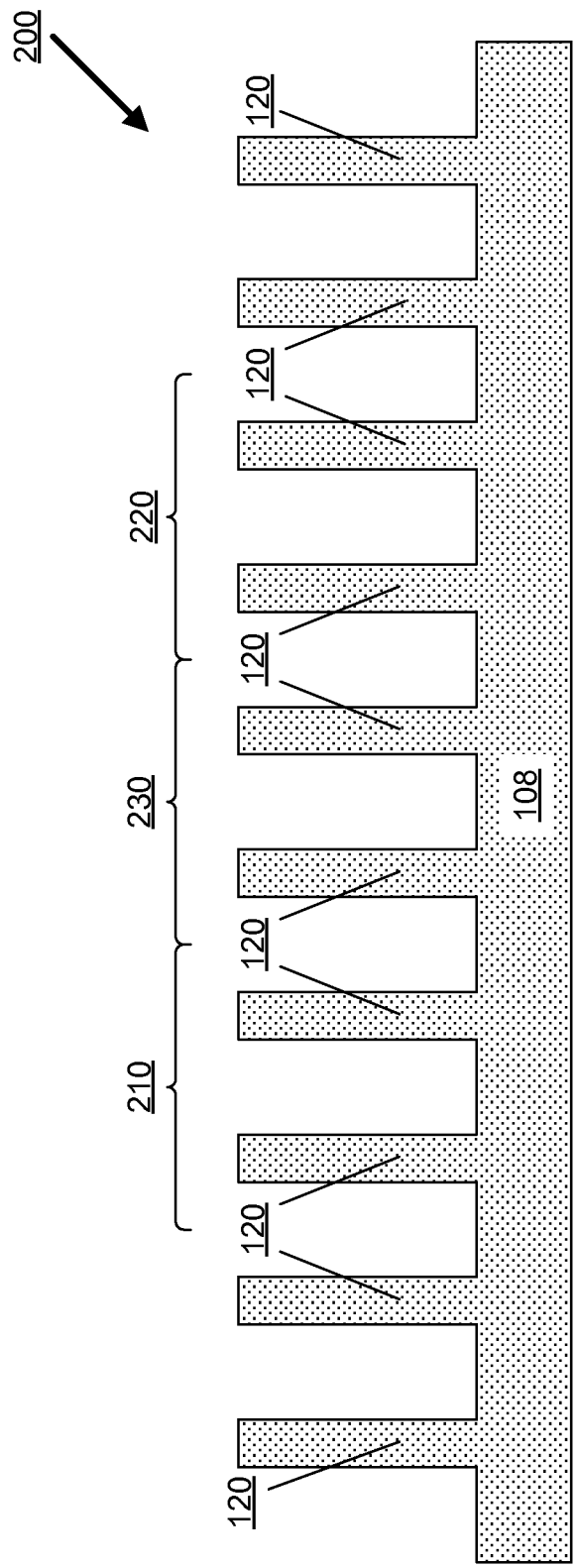
FIG. 6a is a cross-sectional view of FIG. 6 taken along section line A-A, of fins formed on the substrate, according to an exemplary embodiment.

Referring now to FIGS. 6 and 6a, chemical mechanical planarization (CMP) is performed to remove the sidewall spacers 114 and fin caps 116, leaving the fin body 120 on the substrate 108. Following CMP, a semiconductor structure 200 may remain where at least one fin body 120 is located on a substrate 108. The semiconductor structure 200 may have a first fin region 210 and a second fin region 220. The semiconductor structure 200 may have an intermediate fin region 230 located between the first fin region 210 and the second fin region 220. The semiconductor structure 200 may have a central region 240, where the final fin structure may be located. The fin pitch between each fin body 120 may be substantially uniform, such that the distance between adjacent fins in a first fin region 210 is substantially similar to the distance between adjacent fins in adjoining regions (e.g. the distance between a fin on the edge of the first fin region 210 and its adjacent fin on the edge of intermediate fin region 230).

Figure 7:
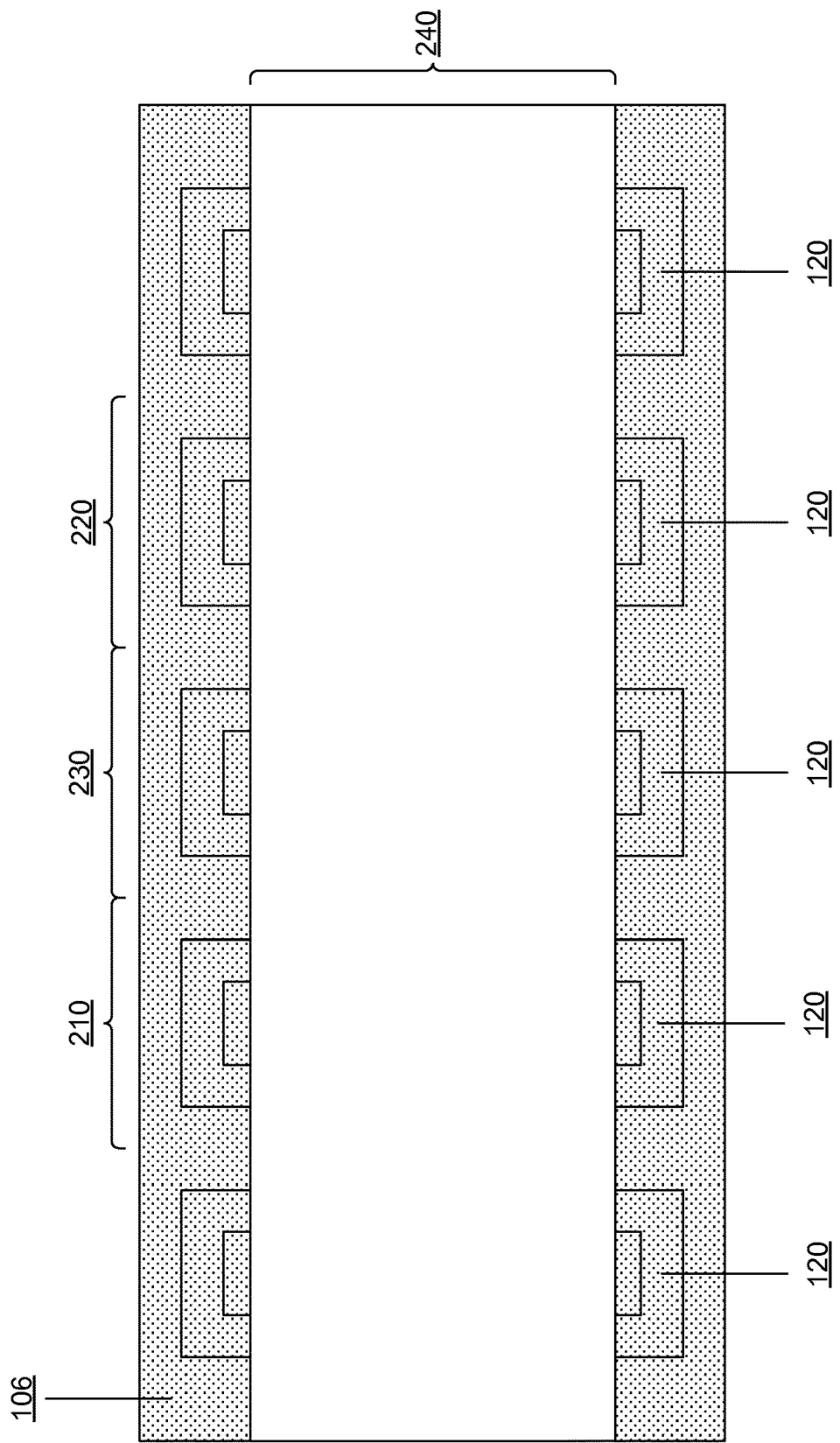
FIG. 7 is a top view of masking a center portion of the fins formed on the substrate, according to an exemplary embodiment.

Referring now to FIG. 7, the central region 240 may be masked, leaving an unwanted portion of the fin body 120 exposed. More specifically, the method may include masking a region of the semiconductor by forming a protective layer, patterning the central region 240, and etching the protective layer from the unpatterned regions. The protective layer may include an oxide (e.g. silicon oxide), a nitride (e.g. silicon nitride) or any combinations thereof. Patterning of the desired region may be done through lithographic techniques, to the desired structure. Etching the masking layer stack may be accomplished through any combination of known techniques, such as, for example, RIE, wet stripping and plasma etching.

Figure 8:
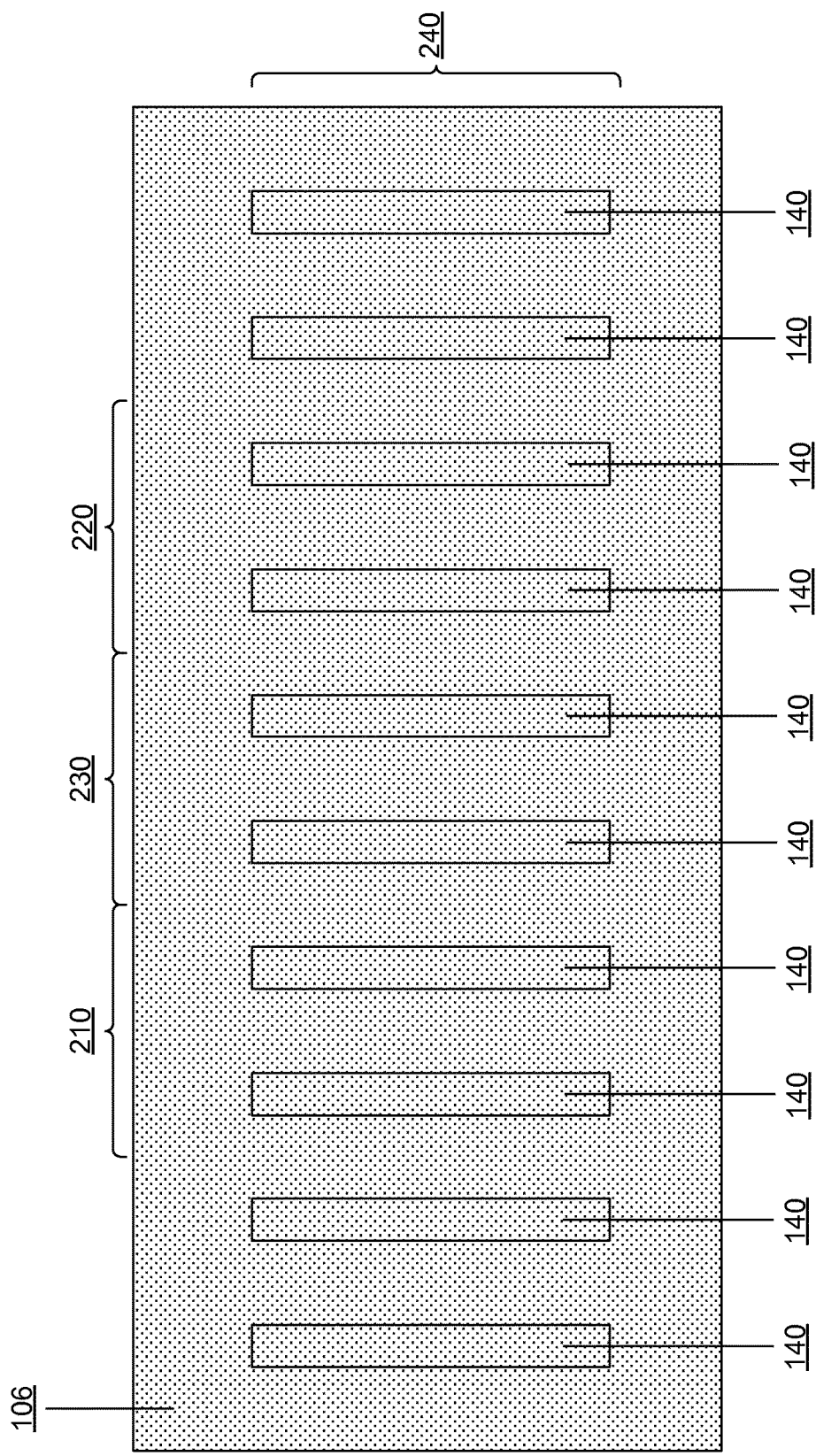
FIG. 8 is a top view of fins on a substrate, according to an exemplary embodiment.

Referring now to FIG. 8, an etch is performed to remove the exposed portion of the fin body 120 to form at least one fin 140 on the substrate 108. This may be accomplished by any suitable means, such as RIE, plasma etching and wet-stripping.

Figure 9:
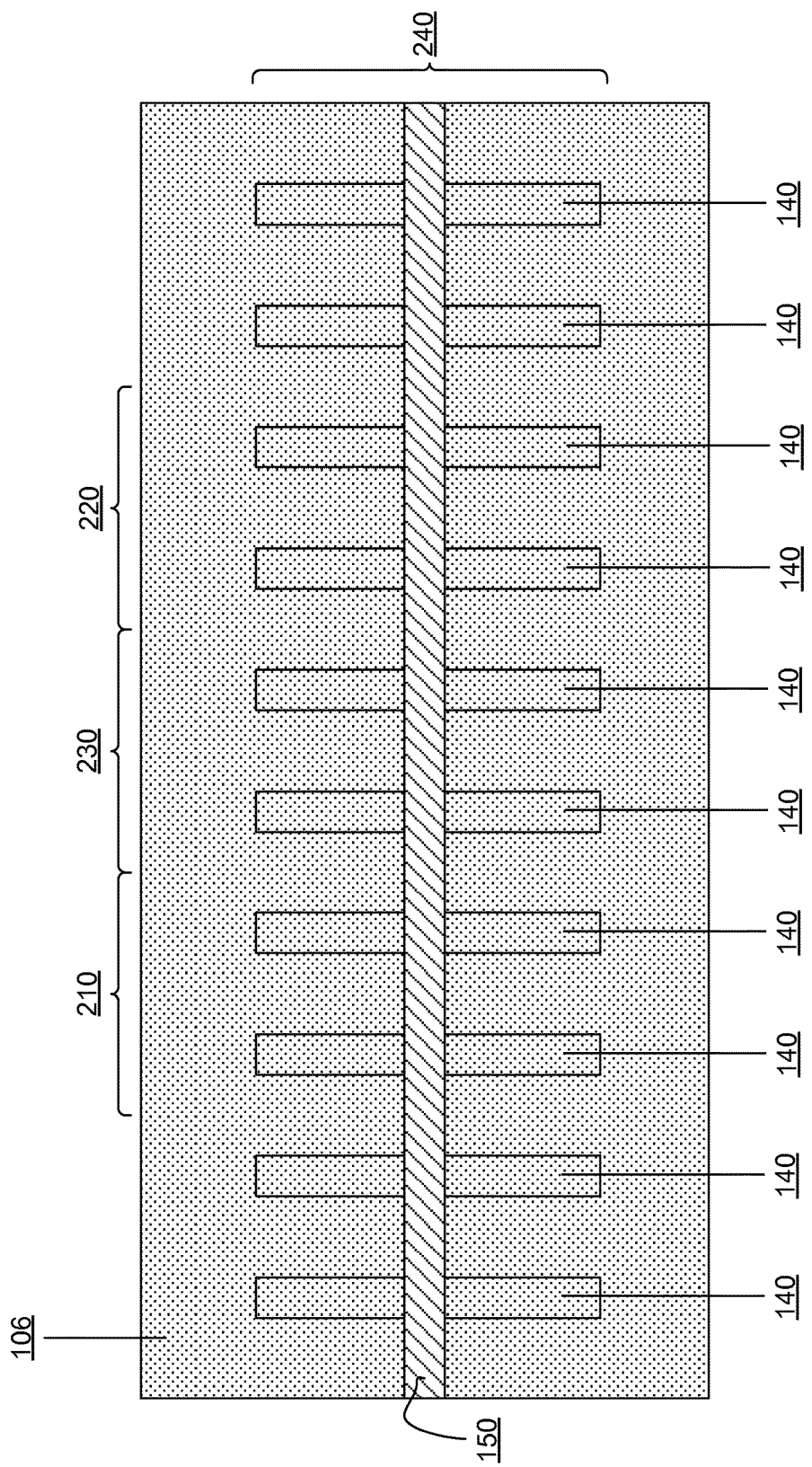
FIG. 9 is a top view of a gate crossing the fins on the substrate, according to an exemplary embodiment.

Referring now to FIG. 9, a gate structure 150 is deposited over the fin structures. The gate structure 150 may be located above the substrate 108, and cross over a portion of the fin 140. The gate structure 150 may be substantially perpendicular to the fin 140, having a gate region where the fin 140 passes through the gate structure 150, and a source/drain region of the fin 140 located on both sides of the gate region. The gate structure 150 may contain a gate layer (not shown), a spacer layer (not shown) and a hard cap (not shown). The gate layer may have a height of approximately 40 nm to approximately 200 nm, preferably approximately 50 nm to approximately 150 nm. The gate layer may include a gate dielectric layer (not shown) on the fin 140 and a gate electrode on the gate dielectric layer (not shown) that may be formed via any known process in the art, including a gate-first process and a gate-last process.

In a gate-first process, the gate dielectric layer may include any suitable insulating material including, but not limited to: oxides, nitrides, oxynitrides or silicates including metal silicates and nitrided metal silicates. In one embodiment, the gate dielectric may include a high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide (TixOy), lanthanum oxide (LaxOy), strontium titanium oxide (SrxTiyOz), lanthanum aluminum oxide (LaxAlyOz), and mixtures thereof. The gate dielectric layer may be deposited over the fin 140 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate layer may include a sacrificial gate (not shown) that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

A spacer may be formed on the vertical surfaces of the gate layer and/or the fin. The spacer may be made of any suitable insulating material, such as silicon nitride, silicon oxide, silicon oxynitrides, or a combination thereof, and may have a thickness ranging from 2 nm to approximately 100 nm. In a preferred embodiment, the spacer may be made of silicon nitride and have a thickness ranging from approximately 2 nm to approximately 25 nm. The spacer may be formed by any method known in the art, including depositing a conformal silicon nitride layer over the gate layer, and performing an anisotropic etch to remove the material from the horizontal surfaces of the structure. Further, in various embodiments, the spacer may include one or more layers.

In some embodiments, the hard cap (not shown) may be located above the gate layer. The hard cap may be made of an insulating material, such as, for example, silicon nitride or silicon oxide, capable of protecting the gate layer during subsequent processing steps. In embodiments where the substrate 108 is a bulk substrate, an insulating layer may be deposited around the base of the fin prior to forming the gate layer to insulate the gate layer from the substrate 108. Further, while only a single gate layer is shown, some embodiments may include more than one gate above the fin 140.

Figure 10:
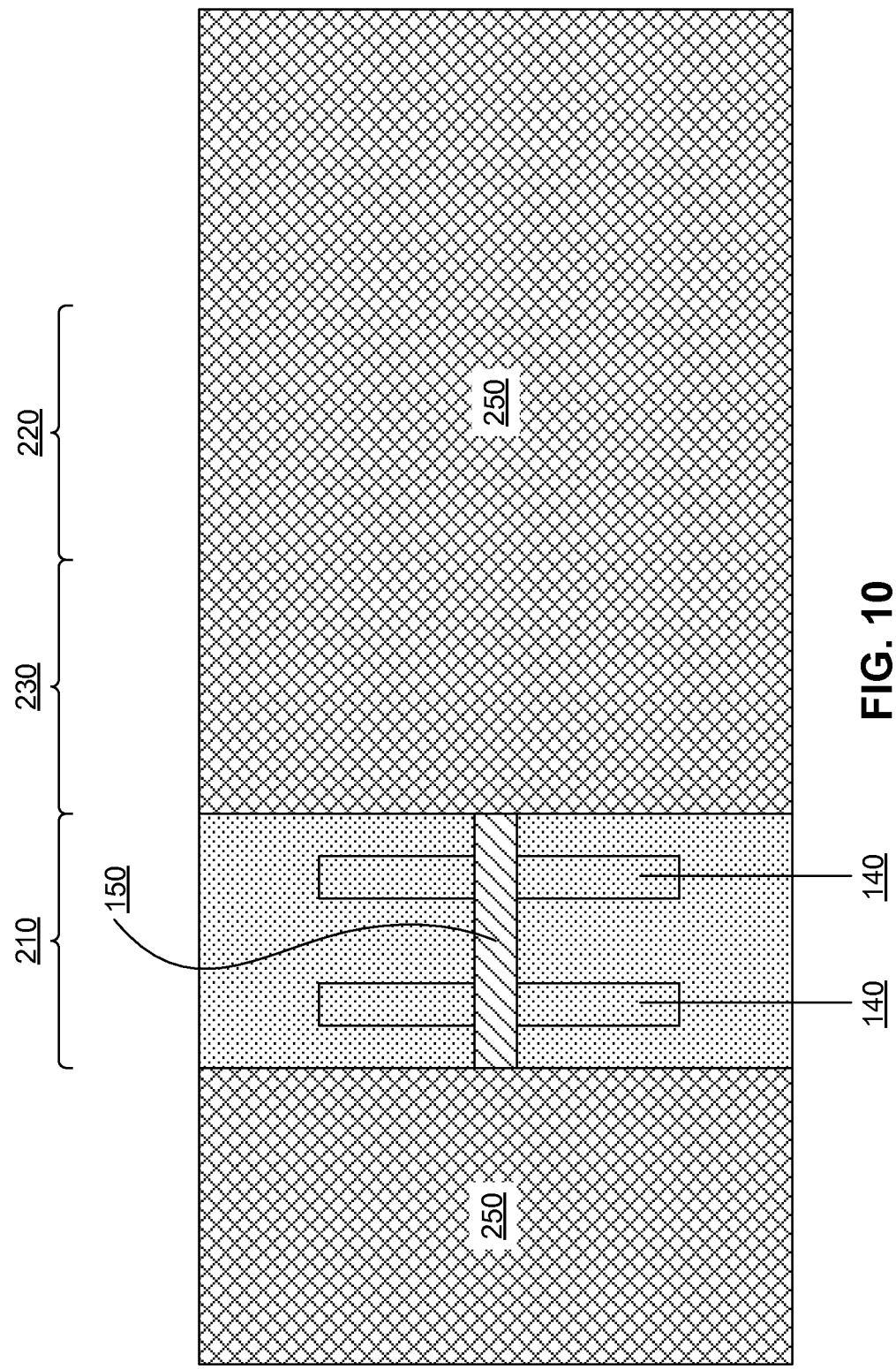
FIG. 10 is a top view of masking all but a first region of fins and a gate, according to an exemplary embodiment.

Referring now to FIG. 10 following the formation of the gate structure 150, a first block mask 250 may be formed covering all but the first fin region 210. More specifically, the method may include masking all but the first fin region 210 of the semiconductor by forming a protective layer, patterning the desired region, and etching the protective layer from the unprotected regions. The protective layer may include an oxide (e.g. silicon oxide), a nitride (e.g. silicon nitride) or any combinations thereof. Patterning of the desired region may be done through lithographic techniques, to the desired structure. Etching the masking layer stack may be accomplished through any combination of known techniques, such as, for example, RIE, wet stripping and plasma etching.

Figure 11:
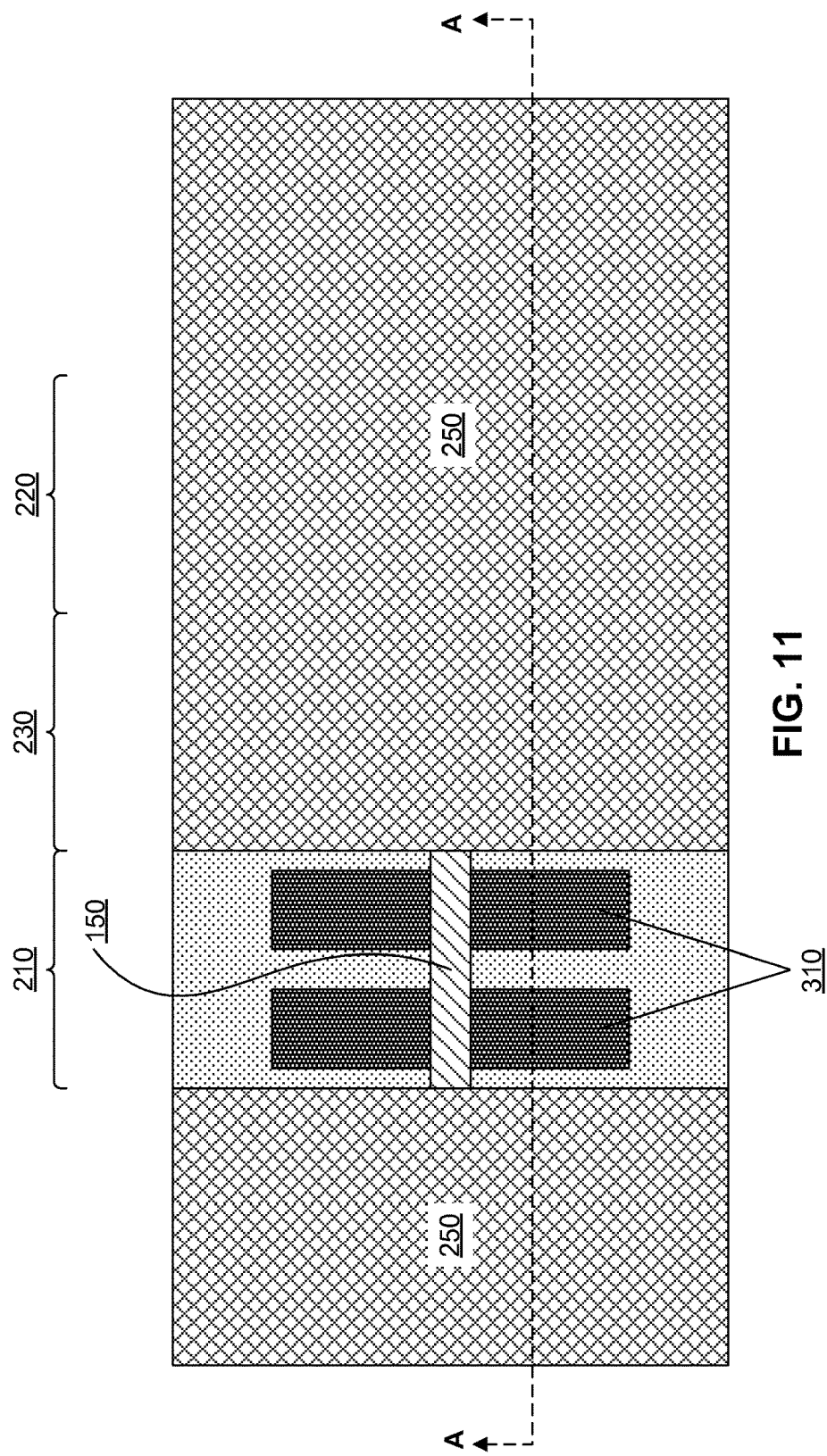
FIG. 11 is a top view of epitaxially growing a material on the fins in a first region, according to an exemplary embodiment.

Referring now to FIGS. 11 and 11a, a first junction 310 is formed on the source/drain region of the fin 140 in the first fin region 210 using epitaxial growth. The first junction 310 may be any semiconductor material, such as the semiconductor materials listed above. In an embodiment, the first junction 310 may be silicon-germanium. In such embodiments, the silicon germanium material may contain, for example, approximately 20% to approximately 100% germanium, approximately 0% to approximately 80% silicon, and may be doped with p-type dopants such as boron in concentrations ranging from approximately $1 \times 10^{20}$ atoms/$cm^3$ to approximately $2 \times 10^{21}$ atoms/cm3. In other exemplary embodiments, the semiconductor material 170 may be carbon doped silicon. In such embodiment, the carbon doped silicon may contain, for example, approximately 0.5% to approximately 2.5% carbon, approximately 97.5% to approximately 99.5% silicon, and may be doped with n-type dopants such as arsenic or phosphorus in concentrations ranging from approximately $1 \times 10^{20}$ atoms/cm3 to approximately 2×1021 atoms/cm3. The first junction 310 may be epitaxially grown on the existing crystal lattice of the fin 140 in the source/drain region.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 12:
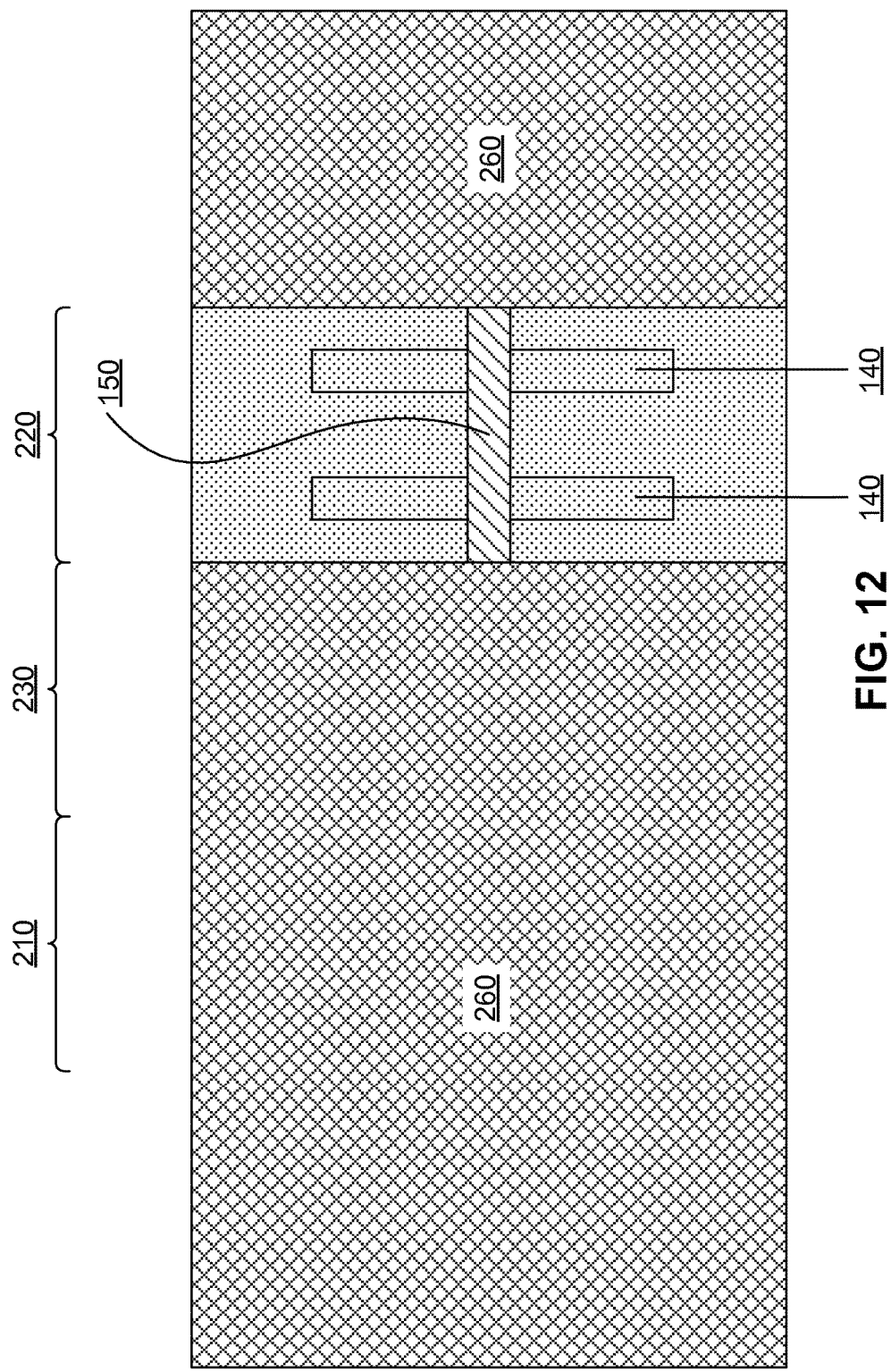
FIG. 12 is a top view of masking all but a second region of fins and a gate, according to an exemplary embodiment.

Referring now to FIG. 12, the first block mask 250 is removed, and a second block mask 260 is applied such that it only leaves a second region 220 exposed. Fin structures are located in an intermediate region 230 located between, but not included in, the first and second region, and are masked by the first block mask 250 and the second block mask 260. Removing first block mask 250 may be accomplished by any suitable means, such as RIE, plasma etching and wetstripping. Following removal of the first block mask 250, a second block mask 260 may be formed such that only the second region 220 is exposed. Specifically, the method may include masking all but the second region 220 of the semiconductor by forming a protective layer, patterning the desired region, and etching the protective layer from the unprotected second region 220. The protective layer may include an oxide (e.g. silicon oxide), a nitride (e.g. silicon nitride) or any combinations thereof. Patterning of the desired region may be done through lithographic techniques, to the desired structure. Etching the masking layer stack may be accomplished through any combination of known techniques, such as, for example, RIE, wet stripping and plasma etching.

Figure 13:
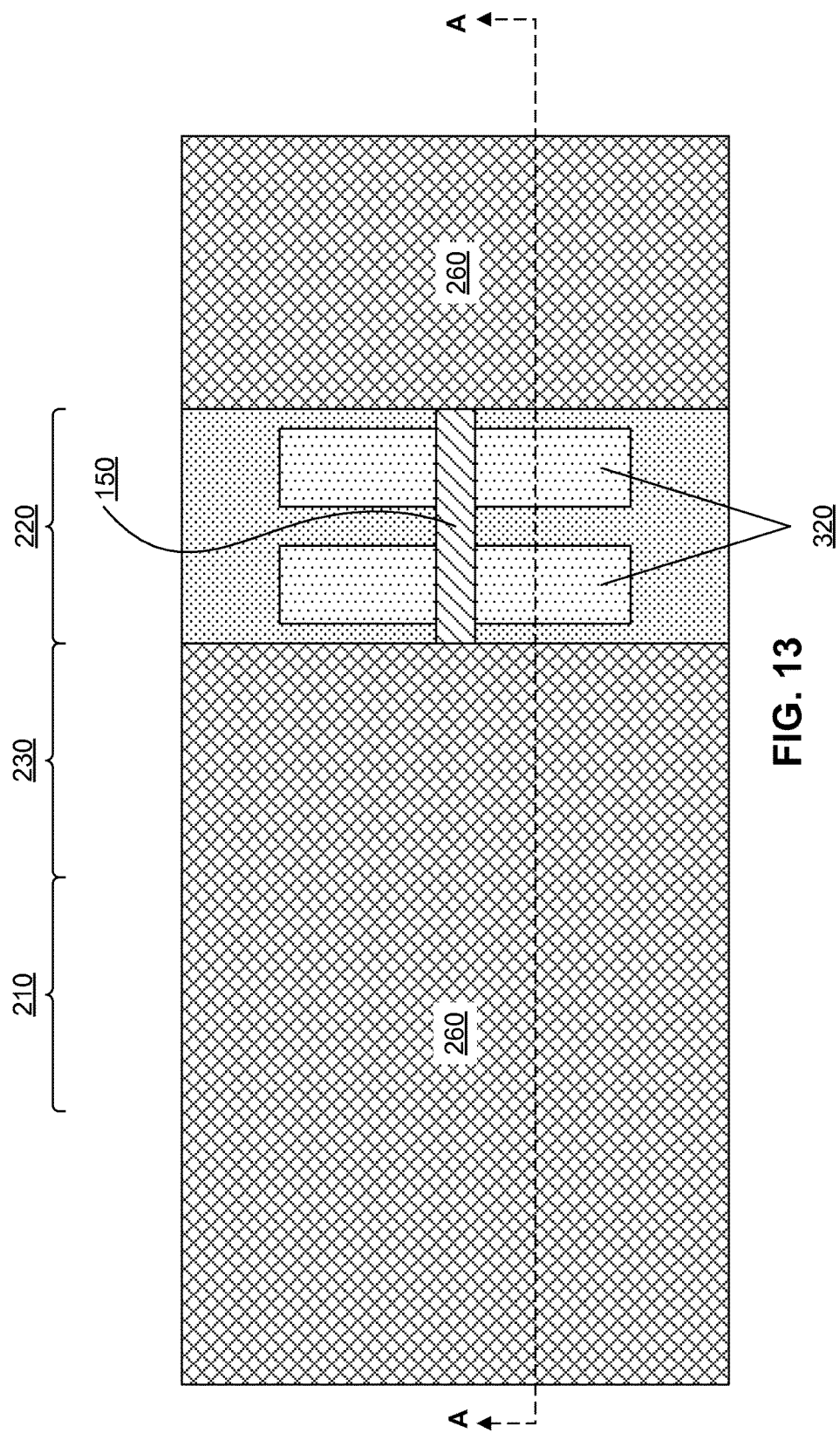
FIG. 13 is a top view of epitaxially growing a material on the fins in a second region, according to an exemplary embodiment.
Figure 13A:
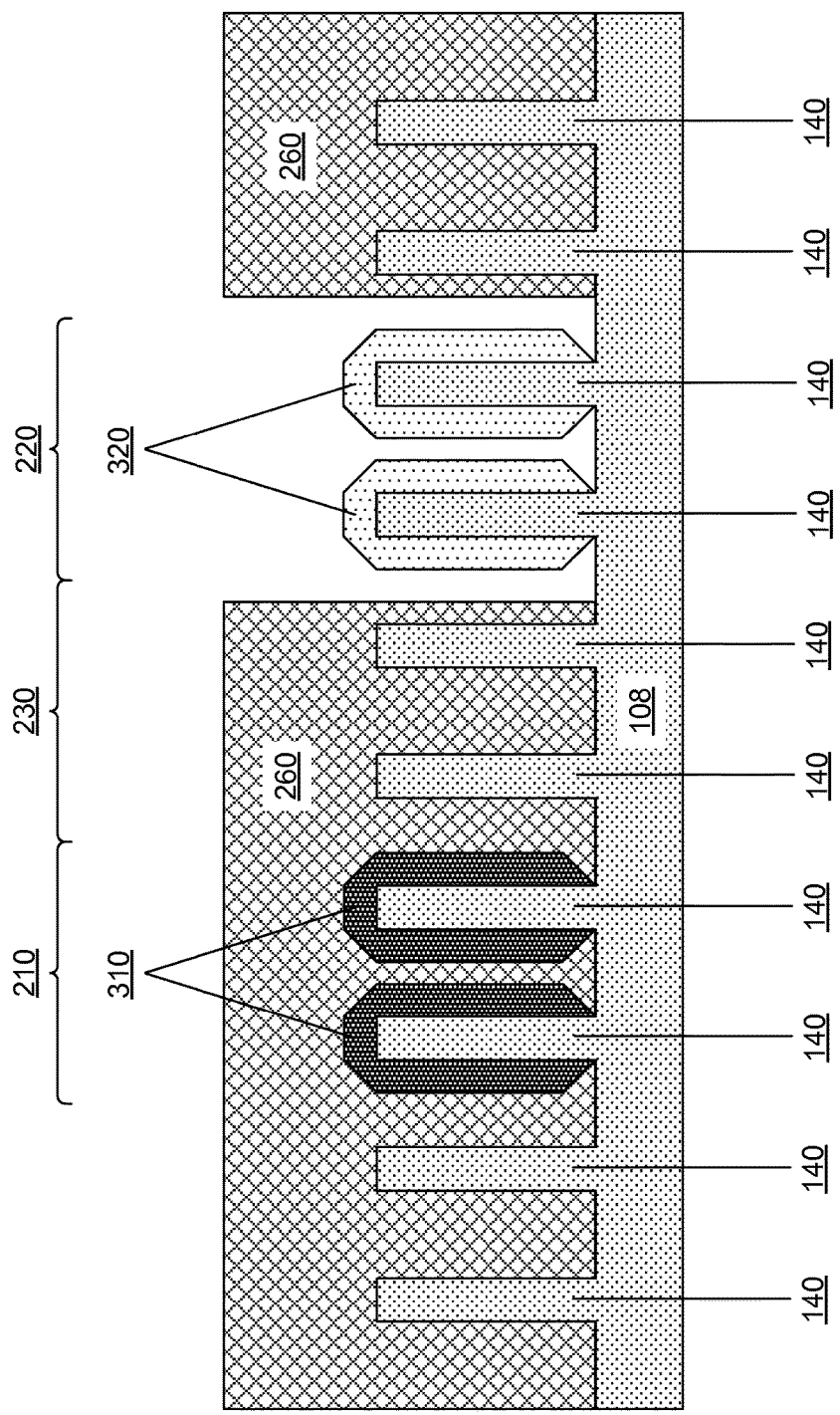
FIG. 13a is a cross-sectional view of FIG. 13 taken along section line A-A, of epitaxially growing a material on the fins in a second, according to an exemplary embodiment.

Referring now to FIGS. 13 and 13a, a second junction 320 is formed on the source/drain region of the fin 140 in the second fin region 220 using epitaxial growth. The semiconductor material may be any semiconductor material, such as the semiconductor materials listed above. In an exemplary embodiment, the second junction 320 may be silicon-germanium. In such embodiments, the silicon germanium material may contain, for example, approximately 20% to approximately 100% germanium, approximately 0% to approximately 80% silicon, and may be doped with p-type dopants such as boron in concentrations ranging from approximately $1\times10^{20}$ atoms/cm$^3$ to approximately $2\times10^{21}$ atoms/cm3. In other exemplary embodiments, the second junction 320 may be carbon doped silicon. In such embodiment, the carbon doped silicon material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/cm3 to approximately 2×1021 atoms/cm3. The second junction 320 may be epitaxially grown on the existing crystal lattice of the exposed portion of the fin 140.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 14:
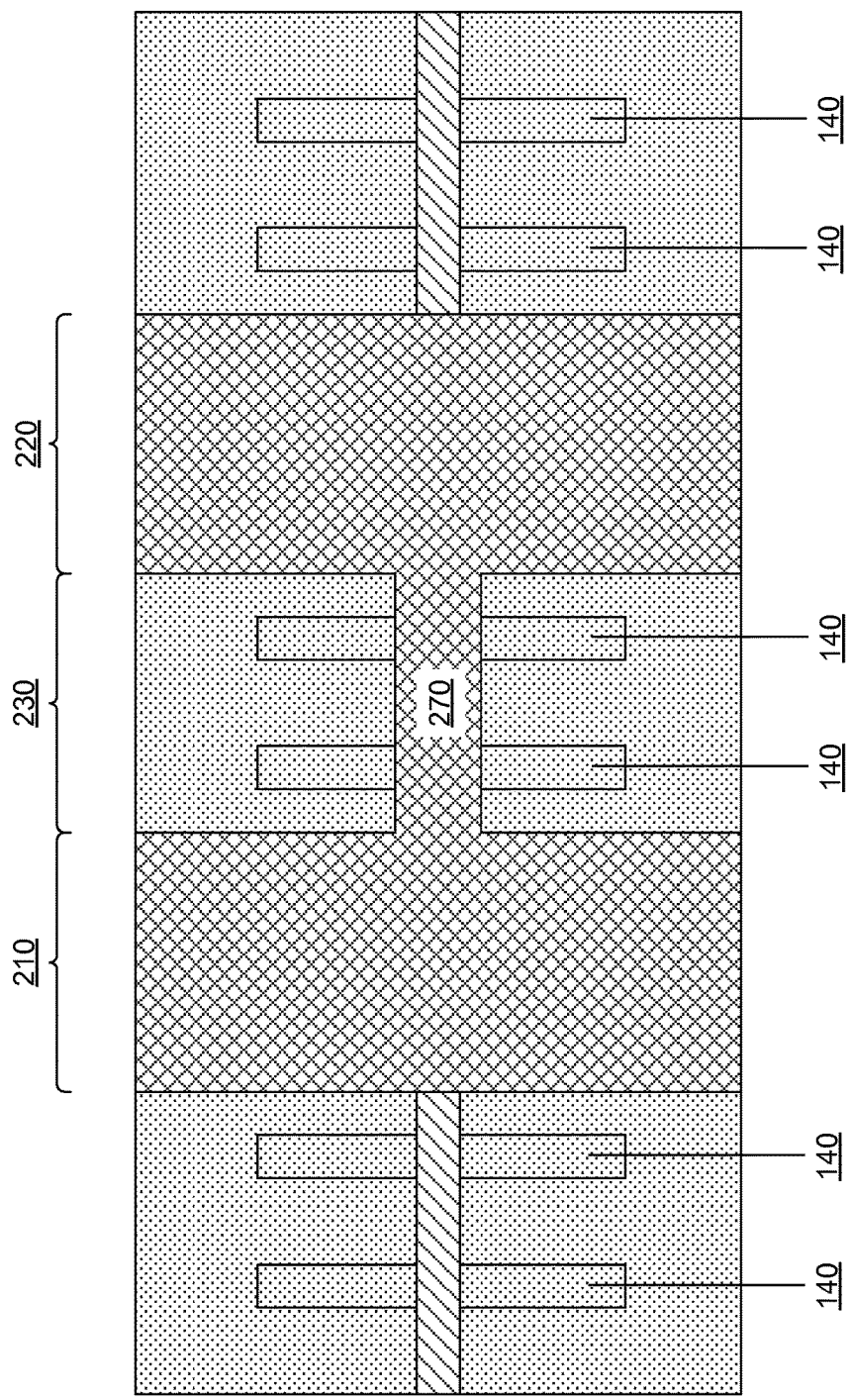
FIG. 14 is a top view of a mask formed over the fins in the first region and second region, according to an exemplary embodiment.

Referring now to FIG. 14, the second block mask 260 is removed, and a third block mask 270 is applied covering the first region 210, the second region 220, and the gate structure 150 located in the intermediate region 230. Removing second block mask 260 may be accomplished by any suitable means, such as RIE, plasma etching and wetstripping. Following removal of the second block mask 260, the third block mask 270 may be formed covering the first region 210, the second region 220, and the gate structure 150 located in the intermediate region 230. Specifically, the method may include masking covering the first region 210, the second region 220, and the gate structure 150 located in the intermediate region 230 of the semiconductor by forming a protective layer, patterning the desired region, and etching the protective layer from the unprotected area. The protective layer may include an oxide (e.g. silicon oxide), a nitride (e.g. silicon nitride) or any combinations thereof. Patterning of the desired region may be done through lithographic techniques, to the desired structure. Etching the masking layer stack may be accomplished through any combination of known techniques, such as, for example, RIE, wet stripping and plasma etching.

Figure 15:
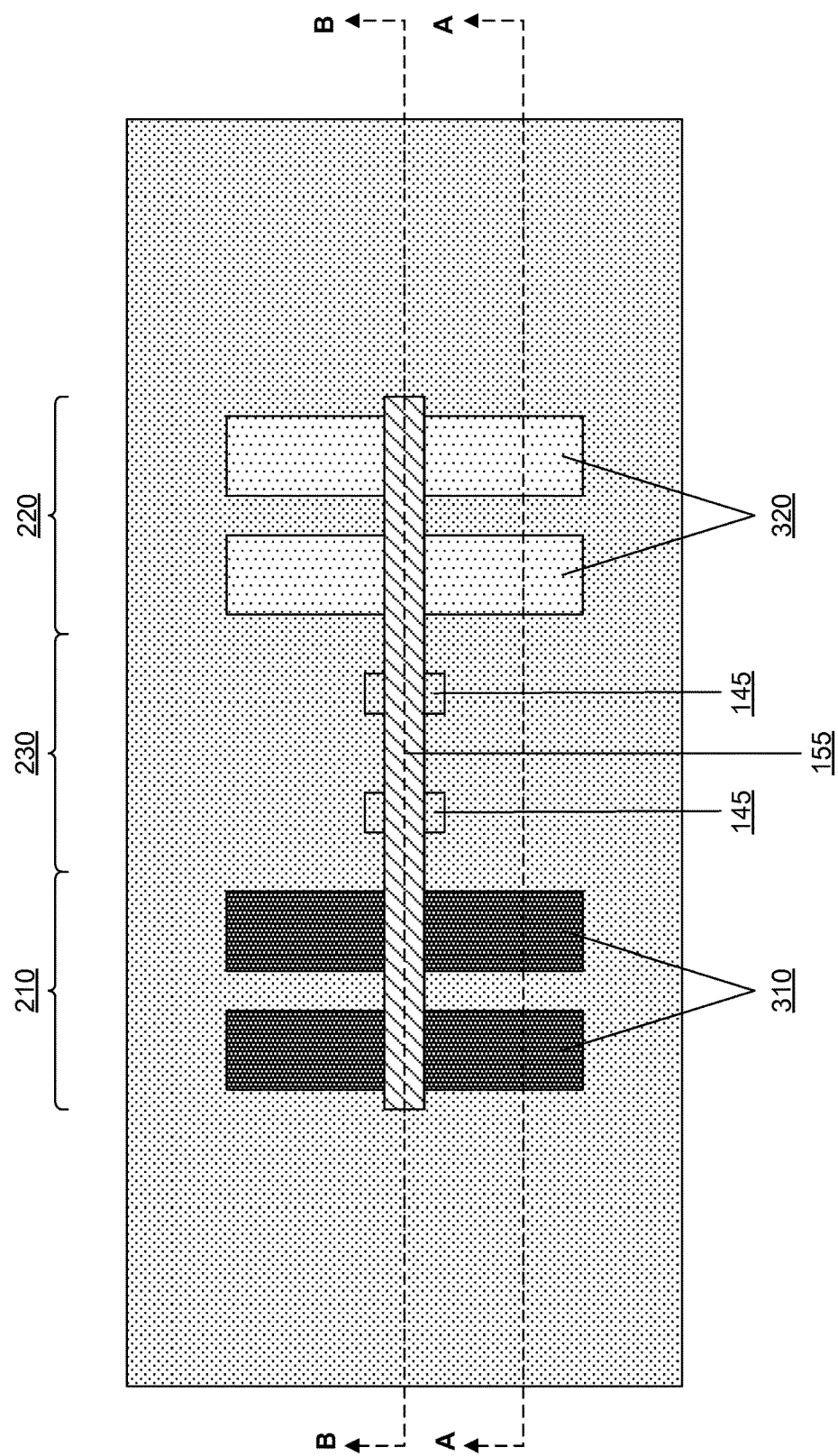
FIG. 15 is a top view of fins and a gate located on a substrate, according to an exemplary embodiment.
Figure 15B:
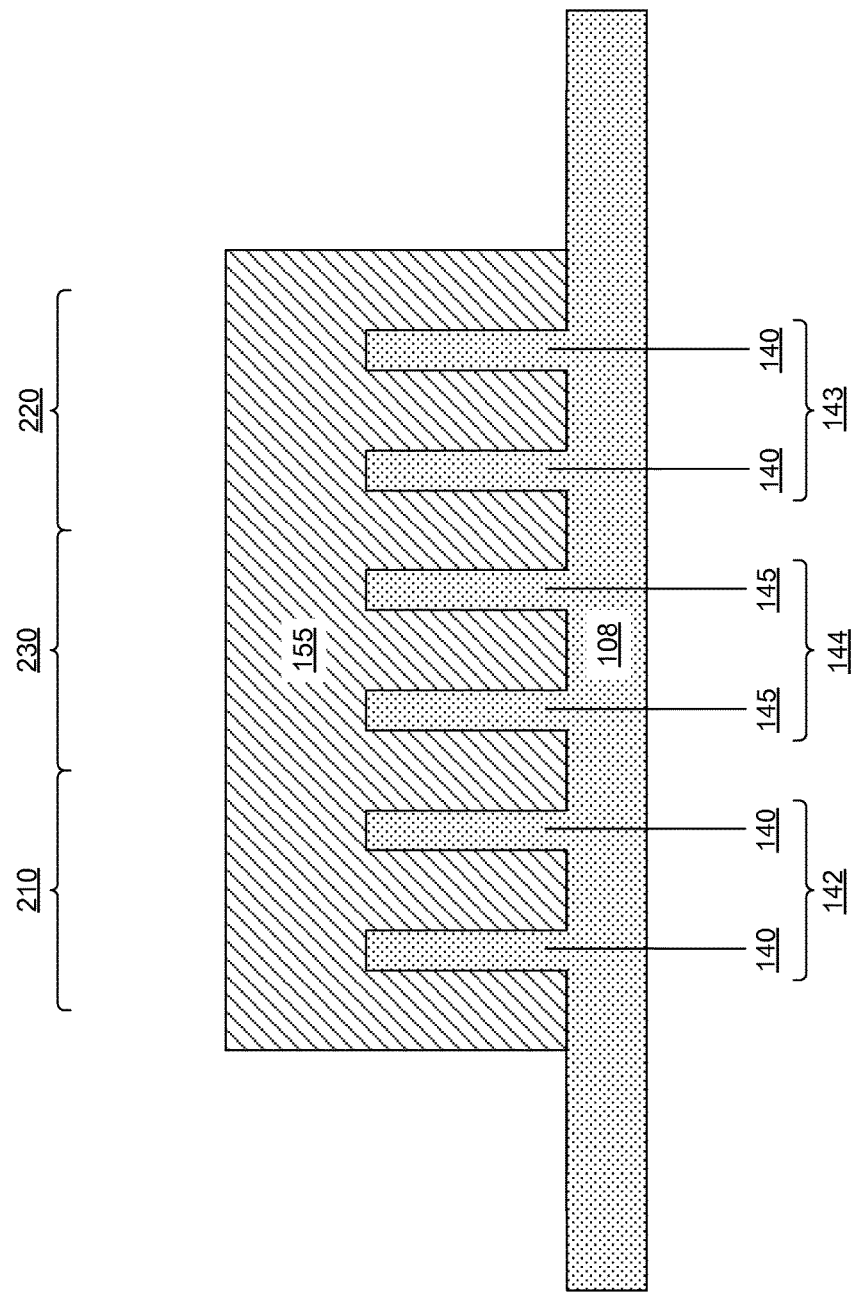
FIG. 15b is a cross-sectional view of FIG. 15 taken along section line B-B, of fins and a gate located on a substrate, according to an exemplary embodiment.

Referring now to FIGS. 15, 15a and 15b, etching is performed to remove the fins located outside the first and second regions, and maintain a continuous gate connection between the first and second region. Removing the third block mask 270 may be accomplished by any suitable means, such as RIE, plasma etching and wetstripping. Following the etch, fins not contained in the first region 210 or the second region 220 may be removed. Additionally, a gate 155 may be formed, where the gate extends from the first region 210 to the second region 220, over the intermediate region 230. Fins that were located between the first region 210 and second region 220 may be removed such that a remnant fin 145 is located beneath the gate 155 in the regions between the first region 210 and second region 220.

Following etching and removal of the mask, a structure remains with a first set of fins 142 is located in a first region 210 and a second set of fins 143 in a second region 220. The first set of fins 142 has a first junction material 310 covering the fins 140 in the source/drain region located on both sides of the gate 155. The second set of fins 143 has a second junction material 320 covering the fins 140 in the source/drain region located on both sides of the gate 155. Located between the first set of fins 142 and the second set of fins 143, is a set of remnant fins 144, containing at least one fin remnant 145. The fin remnant 145 is the portion of the fin 140 left over following etching, and is not used to form any semiconductor structures. In some embodiments, the fin remnant 145 is only present under a gate 155, in the gate region. In other embodiments, the fin remnant 145 may not extend the same length as the first set of fins 142 and the second set of fins 143, but still may contain a portion of the fin in the source/drain region. The gate 155, formed from the gate structure 150, spans the first set of fins 142 to the second set of fins 143, crossing over the remnant fins 144. Additionally, by forming the gate structure 150, prior to removal of fins from unwanted areas, the resulting gate 155 may have a substantially uniform density due to the deposition of material across areas having substantially similar aspect ratios.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure comprising:

forming a plurality of fins on a substrate, the plurality of fins including two fins located in a first region of the substrate, two fins located in a second region of the substrate and two fins located in an intermediate region of the substrate, wherein the intermediate region of the substrate is located between the first region of the substrate and the second region of the substrate, and wherein a first fin of the two fins in the intermediate region of the substrate is positioned adjacent one of the two fins located in the first region of the substrate, and a second fin of the two fins located in the intermediate region of the substrate is positioned adjacent one of the two fins located in the second region of the substrate, the second fin of the two fins positioned between the first fin of the two fins located in the intermediate region of the substrate and the one of the two fins located in the second region of the substrate;

forming a gate over the two fins in the first region of the substrate, the two fins in the second region of the substrate and the two fins in the intermediate region of the substrate;

forming a first mask above at least the intermediate region of the substrate and the second region of the substrate such that the first region is not covered by the first mask;

epitaxially growing a first junction on each of the two fins located in the first region of the substrate that is not covered by the first mask, the first junction grown over a source region and a drain region of each of the two fins located in the first region of the substrate, wherein the source region and the drain region are located on respective sides of the gate in the first region of the substrate;

removing the first mask;

forming a second mask above at least the intermediate region of the substrate and the first region of the substrate such that the second region is not covered by the second mask;

epitaxially growing a second junction on each of the two fins located in the second region of the substrate that is not covered by the second mask, the second junction grown over a source region and a drain region of each of the two fins located in the second region of the substrate, wherein the source region and the drain region are located on respective sides of the gate in the second region of the substrate;

removing the second mask;

forming a third mask above at least the first region of the substrate, the second region of the substrate and the gate after the removing of the second mask such that a portion of the two fins in the intermediate region is not covered by the third mask;

removing material from the region not covered by the third mask including a portion of each of the two fins located in the intermediate region of the substrate that is not beneath the gate, wherein after the removing of the material from the intermediate region, each of the two fins in the first region of the substrate, the two fins of the intermediate region of the substrate, and the two fins in the second region of the substrate include a horizontal length extending along the substrate that is perpendicular to a longest length of the gate extending along the substrate, the horizontal length of the two fins of the intermediate region of the substrate being shorter than the horizontal length of the two fins in the first region of the substrate and the two fins in the second region of the substrate, and wherein the two fins of the intermediate region of the substrate having the shorter horizontal length are substantially aligned with respect to the longest length of the gate extending along the substrate; and completely removing the third mask.

2. The method of claim 1, wherein the first junction comprises a semiconductor material.

3. The method of claim 2, wherein the semiconductor material comprises silicon, silicon-germanium or silicon-carbon.

4. The method of claim 1, wherein the second junction material comprises a semiconductor material.

5. The method of claim 4, wherein the semiconductor material comprises silicon, silicon-germanium or silicon-carbon.

6. The method of claim 1, wherein the substrate is a semiconductor on insulator substrate.

7. The method of claim 1, wherein the fin pitch amongst the plurality of fins is substantially uniform.

8. The method of claim 1, wherein the third mask is formed over a portion of the two fins in the intermediate region that is not located below the gate.

9. The method of claim 1, wherein the gate has a substantially uniform density.

10. The method of claim 1, wherein the removing of the material from the region not covered by the third mask includes removing a majority of the two fins located in the intermediate region such that a remnant fin remains under the gate in the intermediate region.

* * * * *